(12) United States Patent
Kim et al.

(10) Patent No.: US 12,205,547 B2
(45) Date of Patent: Jan. 21, 2025

(54) DISPLAY DEVICE

(71) Applicant: Samsung Display Co., LTD., Yongin-si (KR)

(72) Inventors: Haemin Kim, Yongin-si (KR); Youngwan Seo, Yongin-si (KR); Geunho Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/450,620

(22) Filed: Aug. 16, 2023

(65) Prior Publication Data

US 2024/0177673 A1    May 30, 2024

(30) Foreign Application Priority Data

Nov. 30, 2022 (KR) .................. 10-2022-0164432

(51) Int. Cl.
| | |
|---|---|
| *G09G 3/3233* | (2016.01) |
| *G09F 9/33* | (2006.01) |
| *G09G 3/20* | (2006.01) |
| *G09G 3/3208* | (2016.01) |
| *G09G 3/3266* | (2016.01) |
| *G11C 19/28* | (2006.01) |
| *H10K 59/121* | (2023.01) |
| *H10K 59/131* | (2023.01) |

(52) U.S. Cl.
CPC ......... *G09G 3/3233* (2013.01); *G09G 3/2096* (2013.01); *H10K 59/121* (2023.02); *G09G 2300/0819* (2013.01); *G09G 2300/0852* (2013.01)

(58) Field of Classification Search
USPC ........................................... 345/690
See application file for complete search history.

(56) References Cited

U.S. PATENT DOCUMENTS

| | | | | |
|---|---|---|---|---|
| 2007/0139306 A1* | 6/2007 | Kawada | ................ | G09G 3/294 345/67 |
| 2008/0055208 A1* | 3/2008 | Chung | ................ | G11C 19/184 345/76 |

(Continued)

FOREIGN PATENT DOCUMENTS

| | | |
|---|---|---|
| KR | 10-2018-0112171 | 10/2018 |
| KR | 10-2020-0081628 | 7/2020 |

(Continued)

OTHER PUBLICATIONS

Extended European Search Report for European Application No. 23212265.5, dated Apr. 4, 2024.

*Primary Examiner* — Chineyere D Wills-Burns
(74) *Attorney, Agent, or Firm* — KILE PARK REED & HOUTTEMAN PLLC

(57) ABSTRACT

A display device includes a display area and a peripheral area surrounding the display area, a pixel disposed in the display area on a substrate, an insulating layer disposed on the substrate and having a valley part along a periphery of the display area in the peripheral area, and an emission driver disposed in the peripheral area on the substrate, providing an emission signal to the pixel through an emission line, and overlapping both a first inner surface and a second inner surface of the insulating layer of the valley part in a plan view.

24 Claims, 23 Drawing Sheets

(56) References Cited

U.S. PATENT DOCUMENTS

| | | | |
|---|---|---|---|
| 2009/0051674 A1* | 2/2009 | Kimura | G09G 3/3233 |
| | | | 345/204 |
| 2011/0031493 A1* | 2/2011 | Yamazaki | H01L 27/1251 |
| | | | 438/23 |
| 2017/0052403 A1* | 2/2017 | Iwato | G02F 1/1343 |
| 2017/0084638 A1* | 3/2017 | Koyama | H01L 29/045 |
| 2019/0304375 A1* | 10/2019 | Kim | G09G 3/3258 |
| 2020/0212115 A1* | 7/2020 | Choi | H10K 50/86 |
| 2021/0065632 A1* | 3/2021 | Kim | G09G 3/3233 |
| 2021/0074215 A1* | 3/2021 | Park | G09G 3/3225 |
| 2021/0119178 A1* | 4/2021 | Song | H10K 59/8791 |
| 2021/0193764 A1* | 6/2021 | Cho | H01L 27/1225 |
| 2022/0068212 A1 | 3/2022 | Yao et al. | |
| 2022/0148502 A1 | 5/2022 | Kim et al. | |
| 2022/0173201 A1* | 6/2022 | Kim | H01L 27/1248 |
| 2022/0351659 A1 | 11/2022 | Kwon et al. | |

FOREIGN PATENT DOCUMENTS

| | | |
|---|---|---|
| KR | 10-2021-0044942 | 4/2021 |
| KR | 10-2022-0012966 | 2/2022 |

\* cited by examiner

DISPLAY DEVICE

CROSS-REFERENCE TO RELATED APPLICATIONS

This application claims priority to and benefits of Korean Patent Application No. 10-2022-0164432 under 35 U.S.C. § 119, filed on Nov. 30, 2022 in the Korean Intellectual Property Office, the entire contents of which are incorporated herein by reference.

BACKGROUND

1. Technical Field

The disclosure relates to a display device.

2. Description of the Related Art

As information technology develops, importance of a display device as a connection medium between a user and information is being highlighted. For example, a use of display devices such as a liquid crystal display device (LCD), an organic light emitting display device (OLED), a plasma display device (PDP), a quantum dot display device, or the like is increasing.

The display device has a display area where pixels are disposed and a peripheral area surrounding the display area. Since the peripheral area is formed along an edge of a substrate, structures for preventing permeation of moisture from the outside are disposed in the peripheral area.

An emission driver providing an emission signal to the pixel and a scan driver providing a scan signal to the pixel may also be disposed in the peripheral area. Accordingly, structures for preventing moisture permeation from the outside should be disposed in the peripheral area in consideration of an arrangement of the emission driver and the scan driver.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device with improved reliability.

The technical objectives to be achieved by the disclosure are not limited to those described herein, and other technical objectives that are not mentioned herein would be clearly understood by a person skilled in the art from the description of the disclosure.

A display device according to an embodiment may include a display area and a peripheral area adjacent to the display area; a pixel disposed in the display area on a substrate; an insulating layer disposed on the substrate and having a valley part along a periphery of the display area in the peripheral area; and an emission driver disposed in the peripheral area on the substrate; providing an emission signal to the pixel through an emission line; and overlapping both a first inner surface and a second inner surface of the insulating layer of the valley part in a plan view.

In an embodiment, transistors included in the emission driver may be NMOS transistors.

In an embodiment, transistors included in the emission driver may be PMOS transistors.

In an embodiment, the emission driver may include stages, and each of the stages may include a logic circuit part including an input block which transmits an input signal to a control node and a control block which controls an inversion control node and applies a first low gate voltage to the inversion control node in response to a voltage of the control node and a buffer circuit part including an emission signal output block which outputs a high gate voltage in response to a voltage of the control node and outputs a second low gate voltage in response to a voltage of the inversion control node.

In an embodiment, the first inner surface and the second inner surface of the insulating layer may be disposed between the logic circuit part and the buffer circuit part in a plan view.

In an embodiment, the valley part may overlap a transmission line connecting the logic circuit part and the buffer circuit part in a plan view.

In an embodiment, the first inner surface and the second inner surface may overlap the buffer circuit part in a plan view.

In an embodiment, the emission signal output block may include a first transistor including a gate electrically connected to the inversion control node; a first terminal electrically connected to an emission signal output node through which the emission signal is output; and a second terminal receiving the second low gate voltage and a second transistor including a gate electrically connected to the control node; a first terminal receiving the high gate voltage; and a second terminal electrically connected to the emission signal output node; and the first inner surface and the second inner surface of the insulating layer may be disposed between the first transistor and the second transistor in a plan view.

In an embodiment, the first inner surface and the second inner surface of the insulating layer may overlap the logic circuit part in a plan view.

In an embodiment, one of the first inner surface and the second inner surface of the insulating layer may overlap the buffer circuit part in a plan view, and the other may be spaced apart from the buffer circuit part in a plan view.

In an embodiment, one of the first inner surface and the second inner surface of the insulating layer may overlap the logic circuit part in a plan view, and the other of the first inner surface and the second inner surface of the insulating layer may be spaced apart from the logic circuit part in a plan view.

In an embodiment, one of the first inner surface and the second inner surface of the insulating layer may overlap the buffer circuit part in a plan view, and the other of the first inner surface and the second inner surface of the insulating layer may overlap the logic circuit part in a plan view.

In an embodiment, the logic circuit part may further include a carry signal output block which outputs the high gate voltage as a carry signal in response to the voltage of the control node, and outputs a second low gate voltage different from the first low gate voltage as the carry signal in response to the voltage of the inversion control node.

In an embodiment, the logic circuit part may further include a boosting block which boosts the voltage of the control node.

In an embodiment, the insulating layer may include a first organic insulating layer covering transistors included in the emission driver; and a second organic insulating layer disposed on the first organic insulating layer; and the valley part may include a first valley portion; and a second valley portion.

In an embodiment, a width of the first valley portion may be less than a width of the second valley portion, and the first inner surface and the second inner surface of the valley part may have a step.

In an embodiment, the insulating layer may further include a third organic insulating layer disposed on the second organic insulating layer and having a pixel opening defining the pixel, and a portion of the third organic insulating layer may be removed corresponding to the valley part.

In an embodiment, the pixel may include a pixel circuit including at least one transistor and a light emitting device electrically connected to the pixel circuit, and the light emitting device may include an anode electrode disposed on the substrate, an emission layer disposed on the anode electrode, and a cathode electrode disposed on the emission layer.

In an embodiment, the display device may further include a capping layer disposed in the valley part and the valley part and the capping layer including a same material.

A display device according to an embodiment may include a display area and a peripheral area adjacent to the display area; a pixel disposed in the display area on a substrate; an insulating layer disposed on the substrate and having a valley part along a periphery of the display area in the peripheral area; and a scan driver disposed in the peripheral area on the substrate; providing a scan signal to the pixel through a scan line; and overlapping both a first inner surface and a second inner surface of the insulating layer defining of the valley part in a plan view.

In an embodiment, transistors included in the scan driver may be NMOS transistors.

In an embodiment, transistors included in the scan driver may be PMOS transistor.

A display device according to an embodiment may include a display panel including a pixel; a data driver providing a data signal to the pixel; a scan driver providing a scan signal to the pixel; an emission driver providing an emission signal to the pixel; and a controller controlling the data driver; the scan driver, and the emission driver, and a valley part disposed in a periphery of the display panel passes through at least one of the scan driver and the emission driver.

The display device according to embodiments may include the valley part defined along the periphery of the display area. The first inner surface and the second inner surface of the insulating layer defining the valley part may overlap the emission driver and/or the scan driver in a plan view. For example, the valley part may pass through the emission driver and/or the scan driver. The valley part may be disposed inside the emission driver and/or the scan driver. Accordingly, even if an area of the emission driver and/or an area of the scan driver are increased (for example, the emission driver and/or the scan driver include only NMOS transistors or oxide transistors), the valley part may be formed at a position suitable for preventing permeation of moisture from the outside. Accordingly, moisture or gas introduced from the outside may be blocked by the valley part and may not flow into the display area. Accordingly, a reliability of the display device may be improved.

It is to be understood that both the foregoing general description and the following detailed description are examples and are intended to provide further explanation of the disclosure as claimed.

BRIEF DESCRIPTION OF THE DRAWINGS

Illustrative, non-limiting embodiments will be more clearly understood from the following detailed description taken in conjunction with the accompanying drawings in which.

DETAILED DESCRIPTION OF THE EMBODIMENTS

Figure 1:
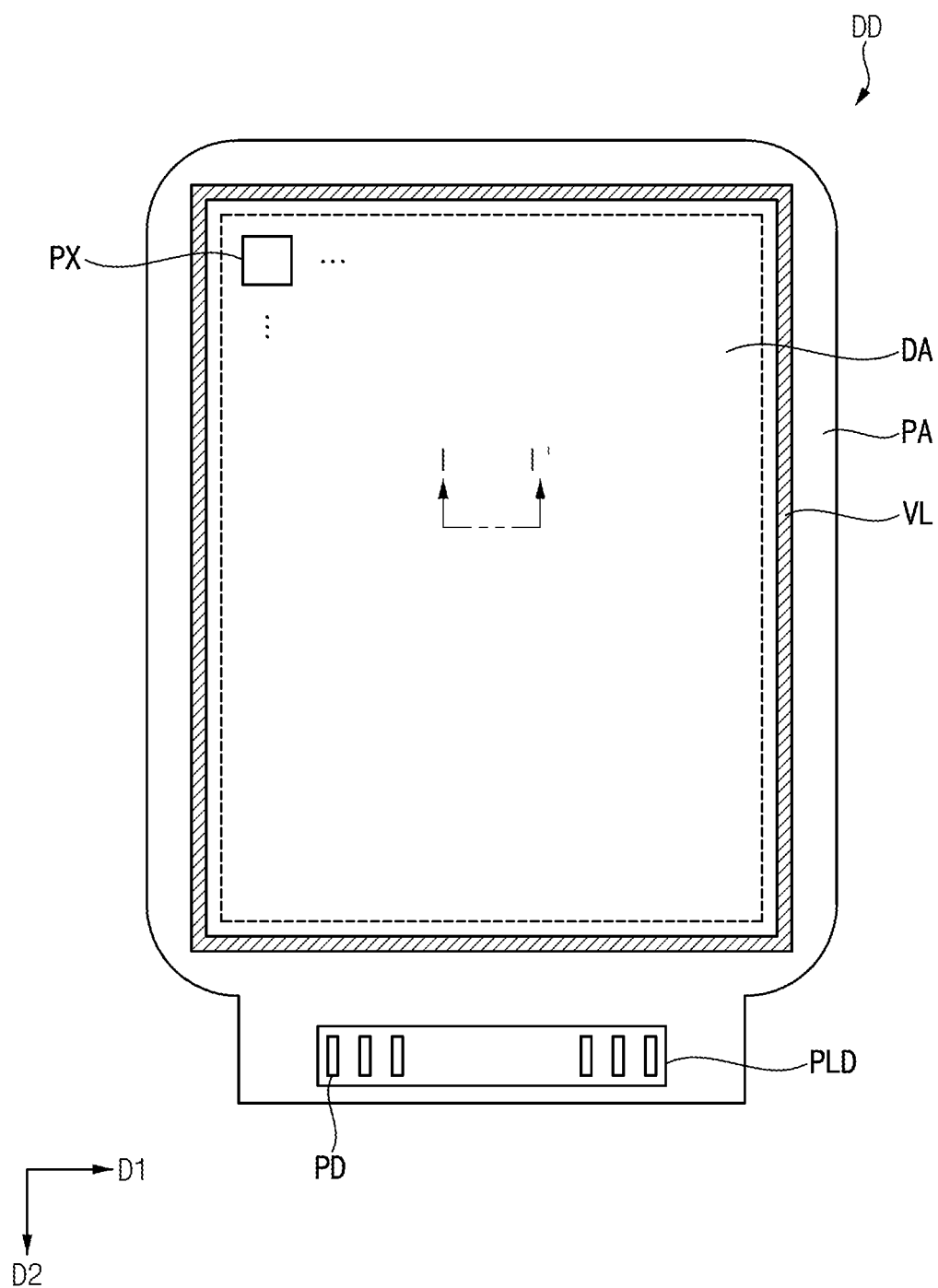
FIG. 1 is a schematic plan view illustrating a display device according to an embodiment.

The disclosure now will be described more fully hereinafter with reference to the accompanying drawings, in which various embodiments are shown. This disclosure may, however, be embodied in many different forms, and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. The term "overlap" or "overlapped" means that a first object may be above or below or to a side of a second object, and vice versa.

Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the related art, and are expressly defined herein and should not be interpreted in an ideal or overly formal sense unless so defined or implied herein.

FIG. 1 is a schematic plan view illustrating a display device according to an embodiment.

Referring to FIG. 1, a display device DD (for example, a substrate SUB of FIG. 6) may include a display area DA and a peripheral area PA. The peripheral area PA may be positioned around the display area DA. For example, the peripheral area PA may surround the display area DA or may be adjacent to the display area DA.

In an embodiment, the display device DD may have a substantially rectangular shape in a plan view. For example, the display device DD may have a rectangular shape with rounded corners in a plan view. However, the disclosure is not necessarily limited thereto, and the display device DD may have various shapes in a plan view. For example, in a plan view, the display device DD may have a rectangular shape with vertical corners. It is to be understood that the shapes disclosed herein may include shapes substantial to the shapes disclosed herein.

Pixels PX may be disposed in the display area DA. In the display area DA, an image may be displayed through the pixels PX. Each of the pixels PX may include a driving device (for example, a transistor) and a light emitting device (for example, an organic light emitting diode) connected to the driving device. The light emitting device may emit light by receiving a signal and/or voltage from the driving device. For example, the driving device may provide a driving current to the light emitting device, and the light emitting device may generate light having a luminance corresponding to the driving current. The pixels PX may be generally disposed in the display area DA. For example, the pixels PX may be entirely arranged or disposed in the display area DA along the first direction D1 and the second direction D2 orthogonal to the first direction D1.

A driver for driving the pixels PX may be disposed in the peripheral area PA. The driver may provide the signal and/or the voltage to the pixels PX. In an embodiment, the driver may include an emission driver, a scan driver, a data driver, and the like within the spirit and the scope of the disclosure.

The peripheral area PA may include a pad area PLD. For example, the pad area PLD may be spaced apart from the display area DA in the second direction D2. Various electronic devices such as an integrated circuit (IC) or a printed circuit board may be electrically attached to the pad area PLD. Pads PD may be disposed in the pad area PLD. The pads PD may receive electrical signals from outside.

A valley part VL may be defined in the peripheral area PA. The valley part VL may be defined by removing a portion of the insulating layer along a periphery of the display area DA. The valley part VL may surround the display area DA. In an embodiment, the valley part VL may have a closed loop shape. However, the disclosure is not necessarily limited thereto, and in an embodiment, the valley part VL may include an open portion in one area or an area.

According to embodiments, moisture or gas introduced from the outside may not flow into the display area DA because it is blocked by the valley part VL. Therefore, defects of the display device DD may be reduced or prevented.

Figure 2:
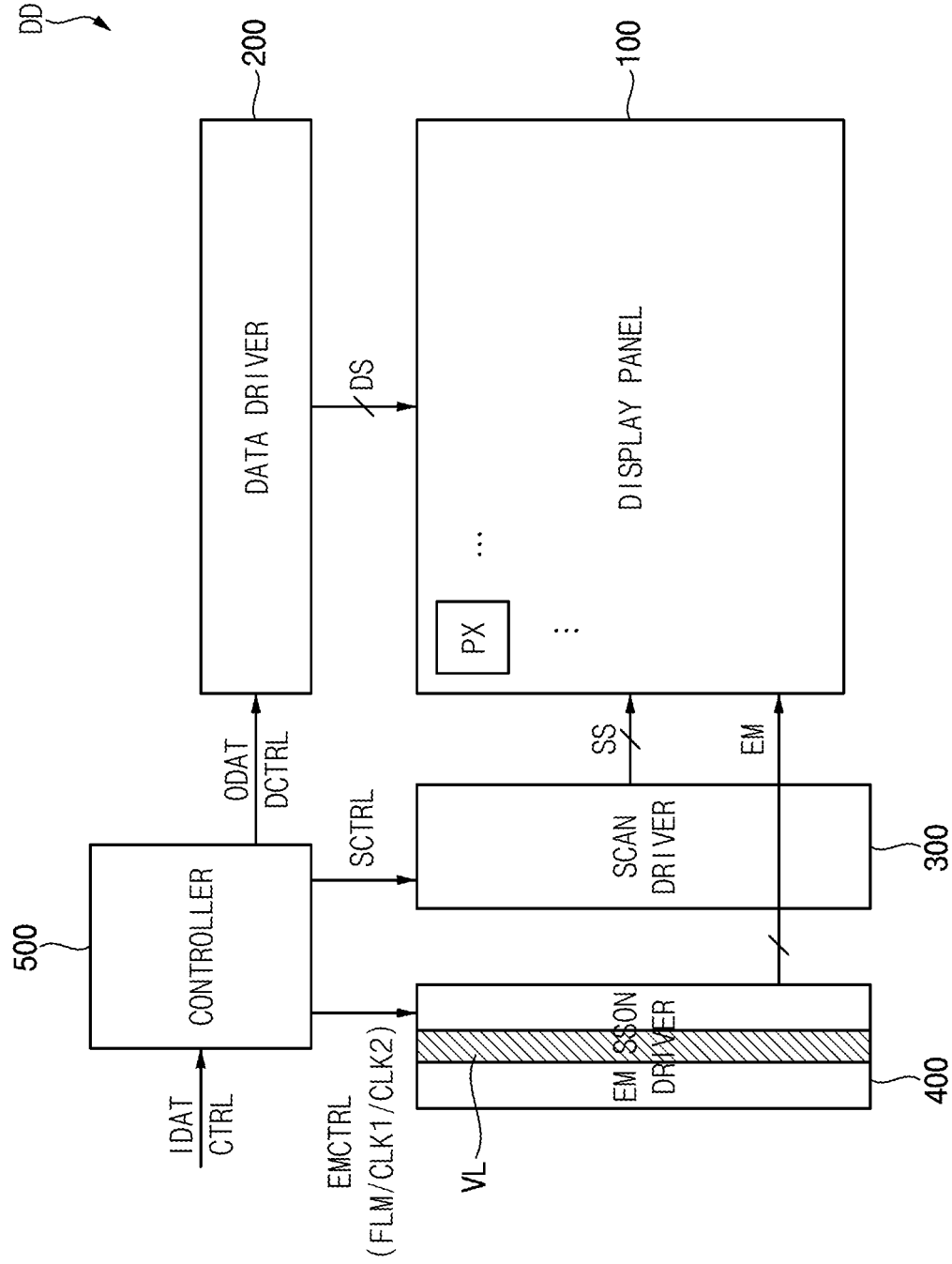
FIG. 2 is a block diagram illustrating the display device of FIG. 1.
Figure 3:
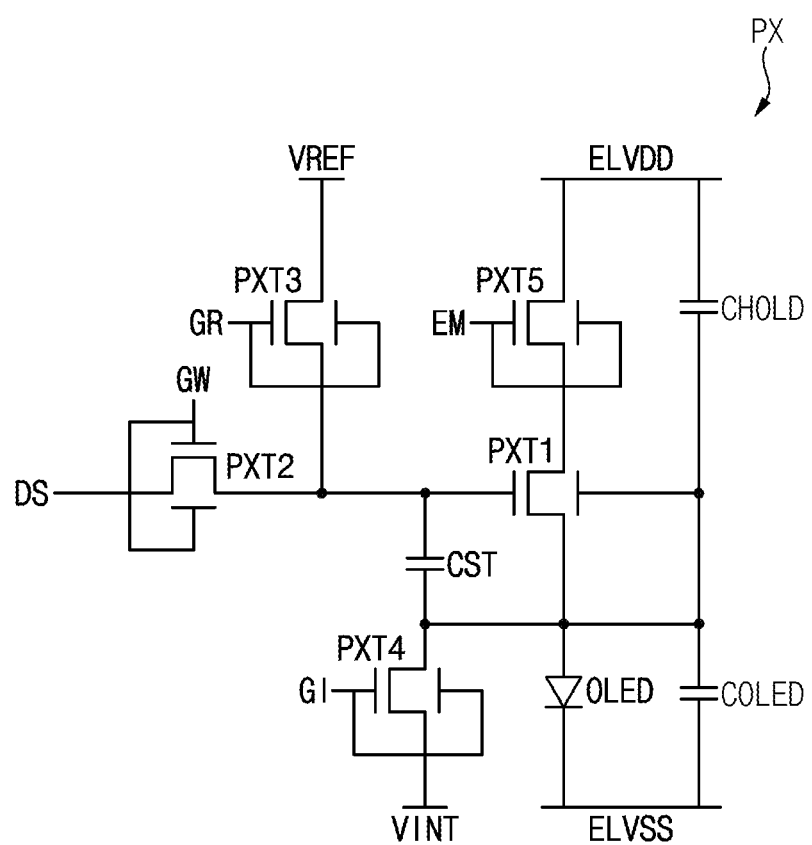
FIG. 3 is a schematic diagram of an equivalent circuit of a pixel illustrating a pixel included in the display device of FIG. 1 according to an embodiment.
Figure 4:
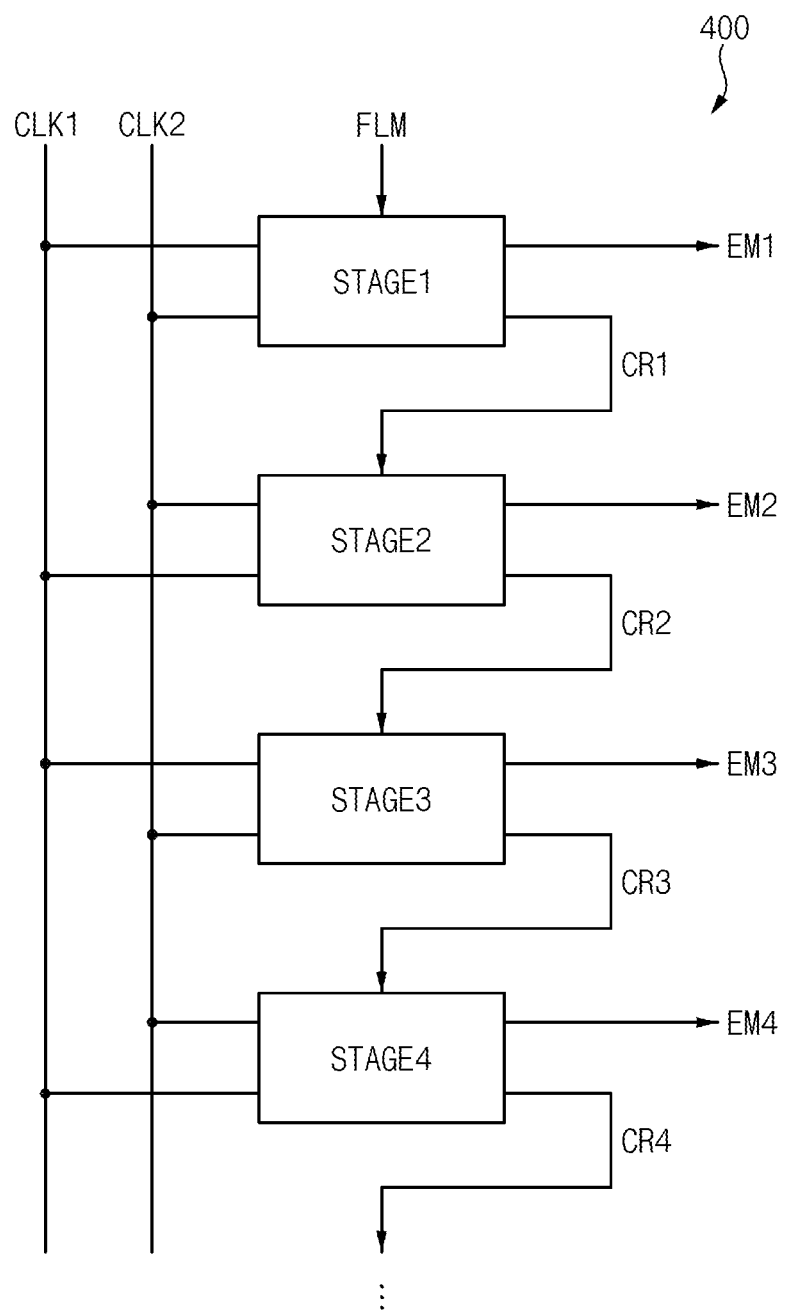
FIG. 4 is a block diagram illustrating an emission driver included in the display device of FIG. 1 according to an embodiment.

FIG. 2 is a block diagram illustrating the display device of FIG. 1, FIG. 3 is a schematic diagram of an equivalent circuit of a pixel illustrating a pixel included in the display device of FIG. 1 according to an embodiment, and FIG. 4 is a block diagram illustrating an emission driver included in the display device of FIG. 1 according to an embodiment.

Referring to FIG. 2, the display device DD may include a display panel 100 including the pixels PX, a data driver 200 providing data signals DS to the pixels PX, scan driver 300 providing scan signals SS to the pixels PX, an emission driver 400 providing emission signals EM to pixels PX, and a controller 500 which controls the data driver 200, the scan driver 300, and the emission driver 400.

The display panel 100 may include data lines, scan lines, emission lines, and the pixels PX connected thereto. In an embodiment, each of the pixels PX may include at least two transistors and an organic light emitting diode (OLED), and the display panel 100 may be an OLED display panel. Also, in an embodiment, the transistors of each of the pixels PX may be oxide transistors or n-channel metal oxide semiconductor (NMOS) transistors.

For example, referring to FIG. 3, each of the pixels PX may include a first pixel transistor PXT1, a second pixel transistor PXT2, a third pixel transistor PXT3, a fourth pixel transistor PXT4, a fifth pixel transistor PXT4, a fifth pixel transistor PXT5, a storage capacitor CST, a hold capacitor CHOLD, and a diode capacitor COLED. The third pixel transistor PXT3 may transmit a reference voltage VREF to a gate node of the first pixel transistor PXT1 and a first electrode of the storage capacitor CST in response to a gate reset signal GR, the fourth pixel transistor PXT4 may transmit an initialization voltage VINT to a second electrode of the storage capacitor CST, an anode of the organic light emitting diode OLED, a second electrode of the hold capacitor CHOLD, and a second electrode of the diode capacitor COLED in response to a gate initialization signal GI. The second pixel transistor PXT2 may transmit the data signal DS to the first electrode of the storage capacitor CST in response to a gate write signal GW, and the storage capacitor CST may store the data signal DS together with the hold capacitor CHOLD and the diode capacitor COLED. The first pixel transistor PXT1 may generate a driving current based on the data signal DS stored in the storage capacitor CST. The fifth pixel transistor PXT5 may form a path of the driving current from a line of a first power voltage ELVDD to a line of a second power voltage ELVSS in response to the emission signal EM. The organic light emitting diode OLED may emit light based on the driving current. The hold capacitor CHOLD may include a first electrode connected to the line of the first power voltage ELVDD, and a second electrode connected to a source node of the first pixel transistor PXT1. The diode capacitor COLED may include a first electrode connected to the source node of the first pixel transistor PXT1 and the second electrode of the hold capacitor CHOLD and a second electrode connected to the line of the second power voltage ELVSS. In an embodiment, the diode capacitor COLED may be a parasitic capacitor of an organic light emitting diode (OLED). In an embodiment, the first pixel transistor PXT1, the second pixel transistor PXT2, the third pixel transistor PXT3, the fourth pixel transistor PXT4, and the fifth pixel transistor PXT5 may be oxide transistors or NMOS transistors. Also, in an embodiment, as shown in FIG. 3, the first transistor PXT1, the second transistor PXT2, the third transistor PXT3, the fourth transistor PXT4, and the fifth transistor PXT5 may have a double gate structure including an upper gate and a lower gate. A lower gate of the first pixel transistor PXT1 may be connected to the second electrode of the hold capacitor CHOLD.

Referring again to FIG. 2, the data driver 200 may generate the data signals DS based on an output image data ODAT and a data control signal DCTRL received from the controller 500, provide the data signals DS to the pixels PX through the data lines. In an embodiment, the data control signal DCTRL may include an output data enable signal, a horizontal start signal, and a load signal, but is not limited thereto. In an embodiment, the data driver 200 and the controller 500 may be implemented as a single integrated circuit, and such an integrated circuit may be referred to as a timing controller embedded data driver (TED). In an embodiment, the data driver 200 and the controller 500 may be implemented as separate integrated circuits. The scan driver 300 may generate the scan signals SS based on a scan control signal SCTRL received from the controller 500 and provide the scan signals SS to the pixels PX through the scan lines. In an embodiment, the scan control signal SCTRL may include a scan start signal and a scan clock signal, but is not limited thereto. Also, in an embodiment, the scan signals SS may include the gate reset signals GR, the gate initialization signals GI, and the gate write signals GW shown in FIG. 3. In an embodiment, the scan driver 300 may be integrated or formed on the periphery of the display panel 100. In an embodiment, the scan driver 300 may be implemented with one or more integrated circuits.

The emission driver 400 may generate the emission signals EM based on an emission control signal EMCTRL received from the controller 500 and provide the emission signals EM to the pixels PX through the emission lines. In an embodiment, the emission control signal EMCTRL may include an emission start signal FLM, a first clock signal CLK1, and a second clock signal CLK2, but is not limited thereto. In an embodiment, the emission driver 400 may be integrated or formed on the periphery of the display panel 100. In an embodiment, the emission driver 400 may be implemented with one or more integrated circuits.

In an embodiment, the valley part VL may pass through the emission driver 400. The valley part VL may be disposed inside the emission driver 400. An arrangement structure of the valley part VL will be described later in detail with reference to FIGS. 7 to 16.

Referring further to FIG. 4, the emission driver 400 may receive a first clock signal CLK1 and a second clock signal CLK2, and include stages (STAGE1, STAGE2, STAGE3, STAGE4, . . . ) which outputs emission signals (EM1, EM2, EM3, EM4, . . . ) and carry signals (CR1, CR2, CR3, CR4, . . . ). The first stage STAGE1 may receive the emission start signal FLM as an input signal, and the stages (STAGE2, STAGE3, STAGE4, . . . ) which are subsequent may receive the carry signals (CR1, CR2, CR3, CR4, . . . ) of the previous stages as an input signal.

Figure 5:
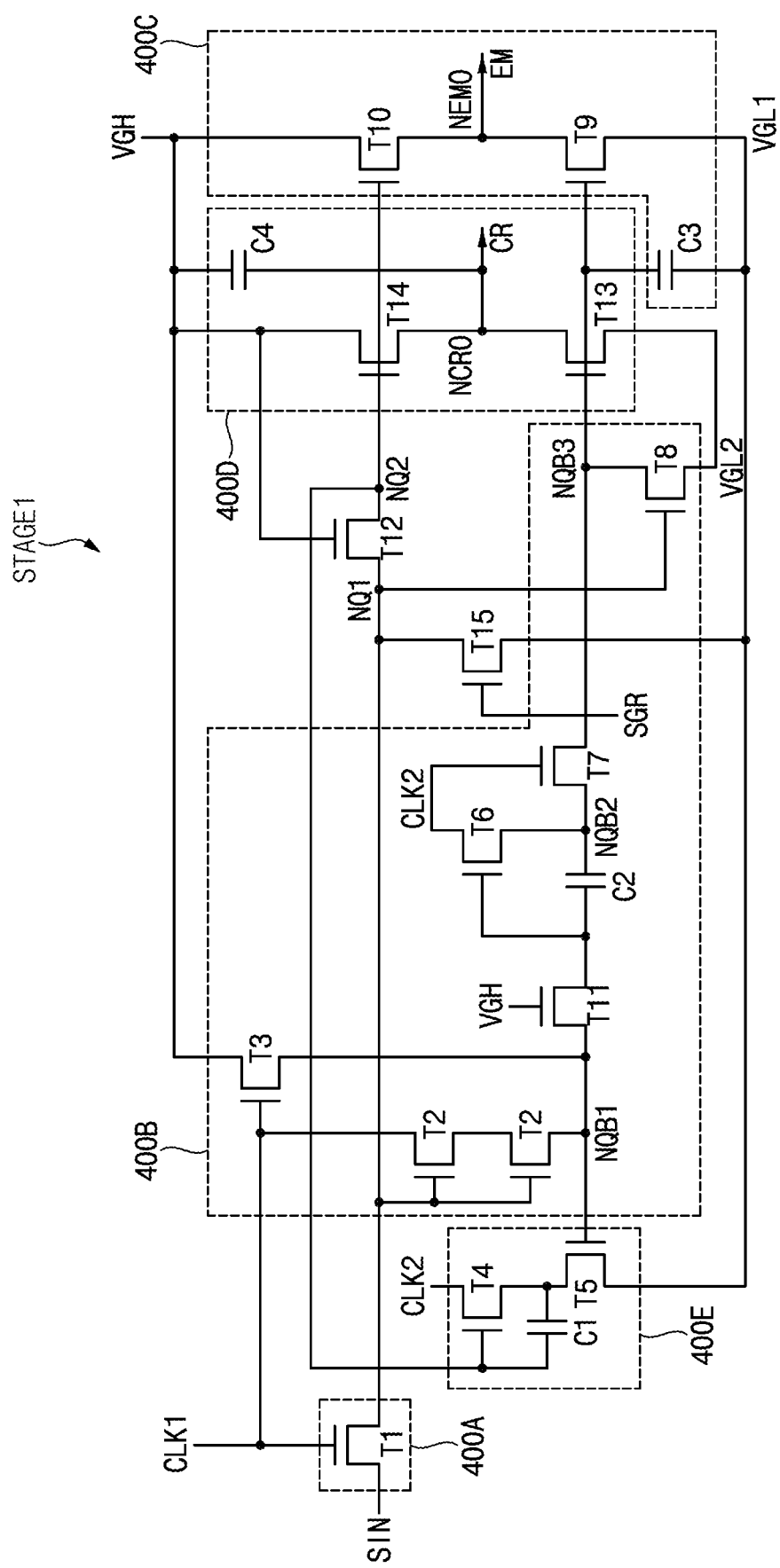
FIG. 5 is a circuit diagram illustrating a stage included in the emission driver of FIG. 4 according to an embodiment.

FIG. 5 is a circuit diagram illustrating a stage included in the emission driver of FIG. 4 according to an embodiment. Hereinafter, with further reference to FIG. 5, a circuit structure of the stages (STAGE1, STAGE2, STAGE3, STAGE4, . . . ) included in the emission driver 400 will be described in detail. At this time, for convenience of description, a circuit structure of the first stage STAGE1 will be described, and since each of the stages (STAGE1, STAGE2, STAGE3, STAGE4, . . . ) has a same circuit structure, descriptions of the stages (STAGE2, STAGE3, STAGE4, . . . ) which remain may be omitted.

Referring to FIG. 5, the first stage STAGE1 may include a logic circuit part LOG and a buffer circuit part BF. In an embodiment, the logic circuit unit LOG may include an input block 400A which transmits the input signal SIN to control nodes NQ1 and NQ2, and a control block 400B which controls inversion control nodes NQB1, NQB2 and NQB3, and a carry signal output block 400D which outputs the carry signal CR based on voltages of the control nodes NQ1 and NQ2 and voltages of the inversion control nodes NQB1, NQB2 and NQB3. The buffer circuit part BF may include an emission signal output block 400C which outputs the emission signal EM based on the voltages of the control nodes NQ1 and NQ2 and the voltages of the inversion control nodes NQB1, NQB2 and NQB3. In an embodiment, the logic circuit part LOG (for example, the first stage STAGE1) may further include a boosting block 400E which boosts the voltages of the control nodes NQ1 and NQ2.

In an embodiment, the logic circuit part LOG (e.g., the first stage STAGE1) may further include a first stress relieving transistor T12 disposed at the control nodes NQ1 and NQ2. The control nodes NQ1 and NQ2 may be divided into a first control node NQ1 and a second control node NQ2 by the first stress relieving transistor T12.

In an embodiment, the logic circuit part LOG (for example, the first stage STAGE1) may include further include a reset transistor T15 which resets the control nodes NQ1 and NQ2 (for example, the first control node NQ1) in response to a global reset signal SGR.

The input block 400A may transmit the input signal SIN to the first control node NQ1 in response to the first clock signal CLK1. The input signal SIN from the first control node NQ1 may be transmitted to the second control node NQ2 by the first stress relieving transistor T12. In an embodiment, the input block 400A of the first stage STAGE1 may receive the emission start signal FLM as the input signal SIN, and the input blocks 400A of the remaining stages may receive the carry signal CR of the previous stage as the input signal SIN. In an embodiment, as shown in FIG.

5, the input block 400A may include a first transistor including a gate receiving the first clock signal CLK1, a first terminal receiving the input signal SIN, and a second terminal connected to the first control node NQ1.

The control block 400B may control the first, second, and third inversion control nodes NQB1, NQB2, and NQB3, and apply a second low gate voltage VGL2 to the third inversion control node NQB3 in response to the voltage of the first control node NQ1. In an embodiment, the control block 400B may include a second transistor T2, a third transistor T3, a second stress relieving transistor T11, a sixth transistor T6, a second capacitor C2, a seventh transistor T7, and an eighth transistor T8.

The second transistor T2 may transmit the first clock signal CLK1 to the first inversion control node NQB1 in response to the voltage of the first control node NQ1. In an embodiment, as shown in FIG. 5, the second transistor T2 may include a gate connected to the first control node NQ1, a first terminal receiving the first clock signal CLK1, and a second terminal connected to the first inversion control node NQB1. In an embodiment, the second transistor T2 may have a dual gate structure.

The third transistor T3 may transmit a high gate voltage VGH to the first inversion control node NQB1 in response to the first clock signal CLK1. In an embodiment, as shown in FIG. 5, the third transistor T3 may include a gate receiving the first clock signal CLK1, a first terminal receiving the high gate voltage VGH, and a second terminal connected to the first inversion control node NQB1.

The second stress relieving transistor T11 may be disposed on the first inversion control node NQB1. The second stress relieving transistor T11 may prevent or reduce a transfer of a boosted voltage of a first electrode of the second capacitor C2 to the second transistor T2, the third transistor T3, and the fifth transistor T5. Accordingly, stresses of the second transistor T2, the third transistor T3, and the fifth transistor T5 may be alleviated. In an embodiment, as shown in FIG. 5, the second stress relieving transistor T11 may include a gate receiving the high gate voltage VGH, a first terminal connected to a first inversion control node NQB1, the second electrode of the second transistor T2, and/or the second electrode of the third transistor T3, and a second terminal connected to the first electrode of a second capacitor C2.

The sixth transistor T6 may transmit the second clock signal CLK2 to the second inversion control node NQB2 in response to the voltage of the first inversion control node NQB1 or the voltage of the first electrode of the second capacitor C2. In an embodiment, as shown in FIG. 5, the sixth transistor T6 may include a gate connected to the first inversion control node NQB1 and/or the first electrode of the second capacitor C2, and a first terminal receiving the second clock signal CLK2, and a second terminal connected to the second inversion control node NQB2.

The second capacitor C2 may boost the voltage of the first inversion control node NQB1 or the voltage of the gate of the sixth transistor T6. The voltage of the gate of the sixth transistor T6 may be boosted by the second capacitor C2, so that the sixth transistor T6 may smoothly transmit the second clock signal CLK2 which has a high level (for example, a voltage level of the high gate voltage VGH). In an embodiment, as shown in FIG. 5, the second capacitor C2 may include a first terminal connected to the first inversion control node NQB1, the second terminal of the second stress relieving transistor T11, and/or the gate of the sixth transistor T6, and the second electrode connected to the second inversion control node NQB2.

The seventh transistor T7 may connect the second inversion control node NQB2 to the third inversion control node NQB3 in response to the second clock signal CLK2. In an embodiment, as shown in FIG. 5, the seventh transistor T7 may include a gate receiving the second clock signal CLK2, a first terminal connected to the second inversion control node NQB2, and a second terminal connected to the third inversion control node NQB3.

The eighth transistor T8 may transmit the second low gate voltage VGL2 to the third inversion control node NQB3 in response to the voltage of the first control node NQ1. In an embodiment, as shown in FIG. 5, the eighth transistor T8 may include a gate connected to the first control node NQ1, a first terminal connected to the third inversion control node NQB3, and a second terminal receiving the second low gate voltage VGL2.

The emission signal output block 400C may output the high gate voltage VGH as the emission signal EM in response to the voltage of the second control node NQ2 and output the first low gate voltage VGL1 as the emission signal EM in response to the voltage of the third inversion control node NQB3. In an embodiment, the emission signal output block 400C may include a ninth transistor T9, a tenth transistor T10, and a third capacitor C3.

The ninth transistor T9 may transmit a first low gate voltage VGL1 to an emission signal output node NEMO to which the emission signal EM is output in response to a voltage of the third inversion control node NQB3. In an embodiment, as shown in FIG. 5, the ninth transistor T9 may include a gate connected to the third inversion control node NQB3, a first terminal connected to the emission signal output node NEMO, and a second terminal receiving the first low gate voltage VGL1.

The tenth transistor T10 may transmit the high gate voltage VGH to the emission signal output node NEMO in response to the voltage of the second control node NQ2. In an embodiment, as shown in FIG. 5, the tenth transistor T10 may include a gate connected to the second control node NQ2, a first terminal receiving the high gate voltage VGH, and a second terminal connected to the emission signal output node NEMO.

The third capacitor C3 may stabilize the voltage of the third inversion control node NQB3. In an embodiment, as shown in FIG. 5, the third capacitor C3 may include a first electrode connected to the third inversion control node NQB3 and a second electrode receiving the first low gate voltage VGL1.

The carry signal output block 400D may output the high gate voltage VGH as the carry signal CR in response to the voltage of the second control node NQ2 and output the second low gate voltage VGL2 different from the first low gate voltage VGL1 in response to the voltage of the third inversion control node NQB3. In an embodiment, the second low gate voltage VGL2 may be lower than the first low gate voltage VGL1. For example, a low voltage of the carry signal CR, for example, the first low gate voltage VGL1 higher than the second low gate voltage VGL2 may be used as a low voltage of the emission signal EM. Leakage current from the emission signal output node NEMO to a line of the first low gate voltage VGL1 through the ninth transistor T9 may be reduced, and waveform distortion of the emission signal EM may be reduced. In an embodiment, the carry signal output block 400D may include a thirteenth transistor T13, a fourteenth transistor T14, and a fourth capacitor C4.

The thirteenth transistor T13 may transmit the second low gate voltage VGL2 to a carry signal output node NCRO from which the carry signal CR is output in response to the voltage of the third inversion control node NQB3. In an embodiment, as shown in FIG. 5, the thirteenth transistor T13 may include a gate connected to the third inversion control node NQB3, a first terminal connected to the carry signal output node NCRO, and a second terminal receiving the second low gate voltage VGL2.

The fourteenth transistor T14 may transmit the high gate voltage VGH to the carry signal output node NCRO in response to the voltage of the second control node NQ2. In an embodiment, as shown in FIG. 5, the fourteenth transistor T14 may include a gate connected to the second control node NQ2, a first terminal receiving the high gate voltage VGH, and a second terminal connected to the carry signal output node NCRO.

The fourth capacitor C4 may reduce waveform distortion of the carry signal CR. In an embodiment, as shown in FIG. 5, the fourth capacitor C4 may include a first electrode receiving the high gate voltage VGH and a second electrode connected to the carry signal output node NCRO.

The boosting block 400E may boost the voltage of the second control node NQ2. Based on the boosted voltage of the second control node NQ2, the tenth transistor T10 and the fourteenth transistor T14 may smoothly transmit the high gate voltage VGH. In an embodiment, the boosting block 400E may include a fourth transistor T4, a first capacitor C1, and a fifth transistor T5.

The fourth transistor T4 may transmit the second clock signal CLK2 to the second electrode of the first capacitor C1 in response to the voltage of the second control node NQ2. In an embodiment, as shown in FIG. 5, the fourth transistor T4 may include a gate connected to the second control node NQ2, a first terminal receiving the second clock signal CLK2, and a second terminal connected to the second electrode of the first capacitor C1.

The first capacitor C1 may boost the voltage of the second control node NQ2. The voltage of the second control node NQ2, for example, the voltage of the gate of the tenth transistor T10 and the gate of the fourteenth transistor T14 may be boosted by the first capacitor C1, so that the tenth transistor T10 and the gate of the fourteenth transistor T14 may smoothly transmit the high gate voltage VGH to the emission signal output node NEMO and the carry signal output node NCRO. In an embodiment, as shown in FIG. 5, the first capacitor C1 may include a first electrode connected to the second control node NQ2 and a second electrode connected to the second terminal of the fourth transistor T4.

The fifth transistor T5 may transmit the first low gate voltage VGL1 to the second electrode of the first capacitor C1 in response to the voltage of the first inversion control node NQB1. In an embodiment, as shown in FIG. 5, the fifth transistor T5 may include a gate connected to the first inversion control node NQB1, a first terminal connected to the second electrode of the first capacitor C1, and a second terminal receiving the first low gate voltage VGL1.

The first stress relieving transistor T12 may prevent or reduce the boosted voltage of the second control node NQ2 from being transferred to the first control node NQ1, and thus, stresses of the first, second, eighth, and fifteenth transistors T1, T2, T8, and T15 connected to the first control node NQ1 may be alleviated. In an embodiment, as shown in FIG. 5, the first stress relieving transistor T12 may include a gate receiving a high gate voltage VGH, a first terminal connected to the first control node NQ1, and a second terminal connected to the second control node NQ2.

The reset transistor T15 may reset the first control node NQ1 to the first low gate voltage VGL1 in response to the global reset signal SGR. In an embodiment, the global reset signal SGR may be substantially simultaneously applied to the stages when the display device including the emission driver 400 is powered on, and the reset transistors T15 of the stages may substantially simultaneously reset the first control nodes NQ1 of the stages to the first low gate voltage VGL1 in response to the global reset signal SGR. The first low gate voltage VGL1 at the first control nodes NQ1 of the stages is controlled by the second stress relieving transistors T12 of the stages. The second control nodes NQ2 of the stages may also be reset to the first low gate voltage VGL1. In an embodiment, as shown in FIG. 5, the reset transistor T15 may include a gate receiving the global reset signal SGR, a first terminal connected to the first control node NQ1, and a second terminal receiving a first low gate voltage VGL1.

In an embodiment, as shown in FIG. 5, the transistors T1 to T15 included in the first stage STAGE1 may be NMOS transistors or oxide transistors. Accordingly, the emission driver 400 including a stage having NMOS transistors or oxide transistors may be suitable for pixels implemented with oxide transistors or NMOS transistors or a display panel including the pixels.

However, the disclosure is not necessarily limited thereto, and at least one of the transistors T1 to T15 included in the first stage may be PMOS transistors or silicon transistors. For example, all of the transistors T1 to T15 included in the first stage may be PMOS transistors or silicon transistors.

The controller (for example, a timing controller (T-CON)) 500 may receive an input image data IDAT and a control signal CTRL from an external host (for example, an application processor (AP), a graphics processing unit GPU, or a graphic card. In an embodiment, the control signal CTRL may include a vertical synchronization signal, a horizontal synchronization signal, an input data enable signal, and a master clock signal, but is not limited to. The controller 500 may generate the output image data ODAT, the data control signal DCTRL, the scan control signal SCTRL, and the emission control signal EMCTRL based on the input image data IDAT and the control signal CTRL. The controller 500 may control the data driver 200 by providing the output image data ODAT and the data control signal DCTRL to the data driver 200, and control the scan driver 300 by providing the scan control signal SCTRL to the scan driver 300, and control the emission driver 400 by providing the emission control signal EMCTRL to the emission driver 400.

Figure 6:
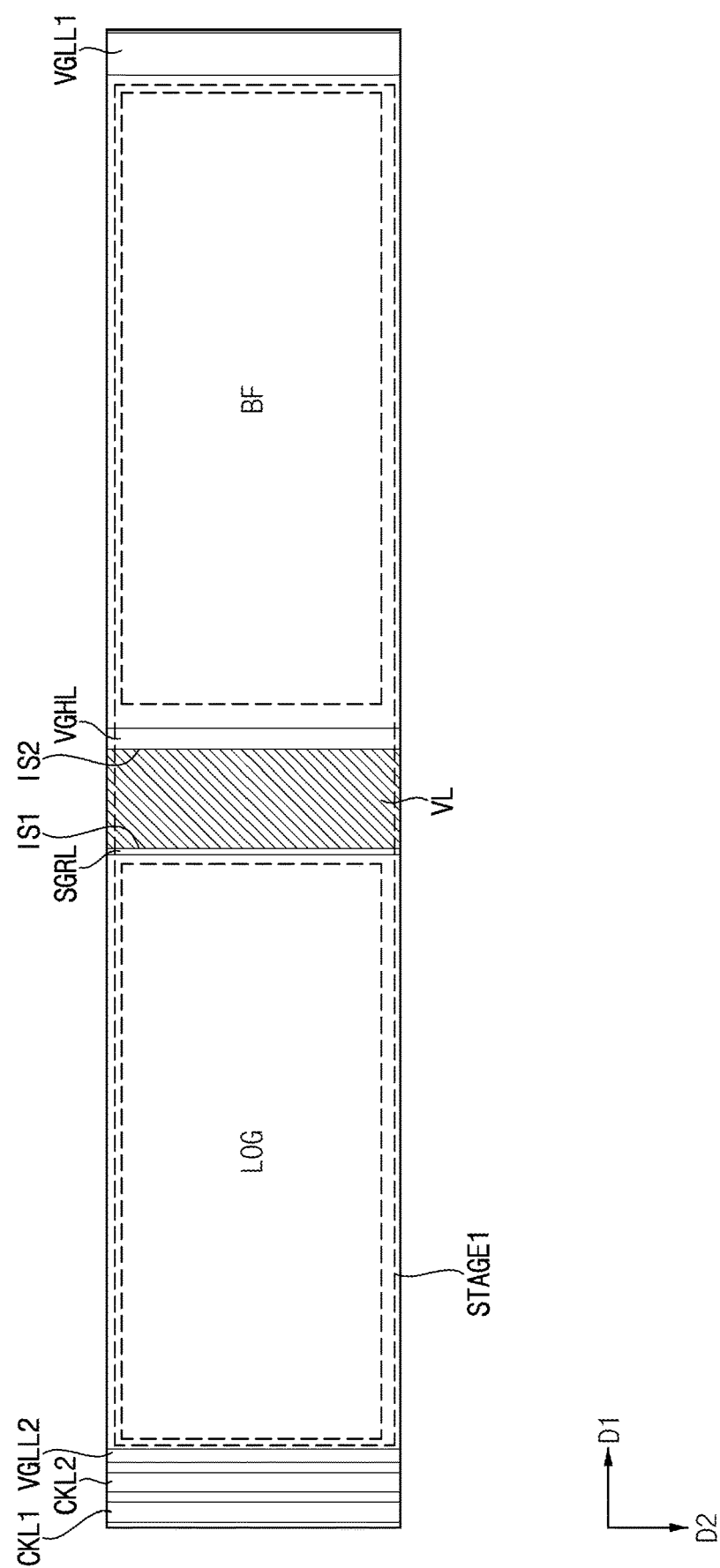
FIG. 6 is a schematic plan view schematically illustrating a stage included in the emission driver of FIG. 4 according to an embodiment.
Figure 7:
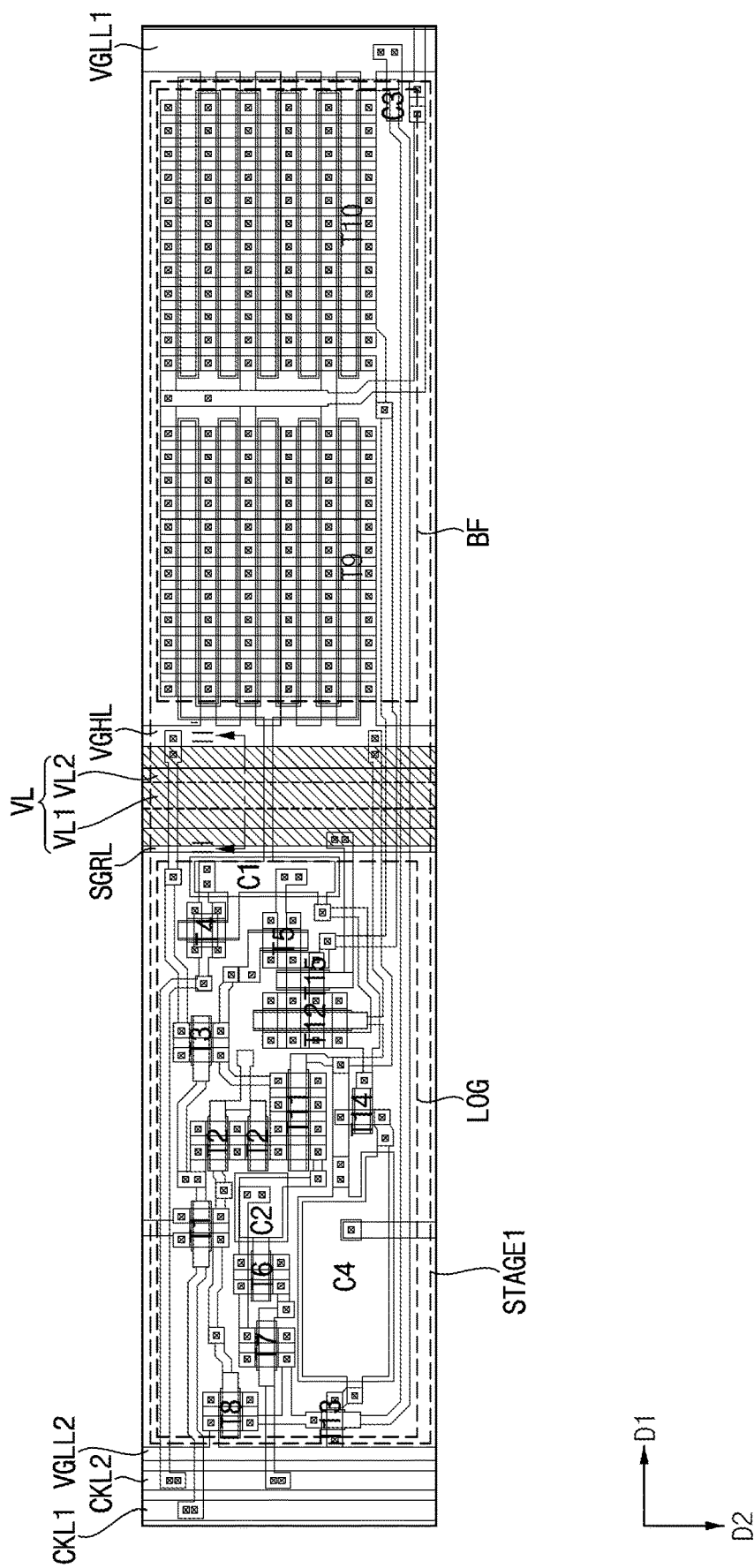
FIGS. 7 to 14 are schematic plan views illustrating a stage included in the emission driver of FIG. 4 according to an embodiment.

FIG. 6 is a schematic plan view schematically illustrating a stage included in the emission driver of FIG. 4 according to an embodiment.

For convenience of description, a plan structure of the first stage STAGE1 will be described, and since each of the stages (STAGE1, STAGE2, STAGE3, STAGE4, . . . ) has a same circuit structure, descriptions of the stages (STAGE2, STAGE3, STAGE4, . . . ) which remain may be omitted.

Referring to FIGS. 1, 2, 4, and 6, the first stage STAGE1 may be disposed around the display panel 100. In a plan view, a first gate driving voltage line VGLL1 may be disposed on a right side of the first stage STAGE1, and a first clock line CKL1, a second clock line CKL2, and a second gate driving voltage line VGLL2 may be disposed on a left side of the first stage STAGE1. The logic circuit part LOG of the first stage STAGE1 and the buffer circuit part BF of the first stage STAGE1 may be defined between the second gate driving voltage line VGLL2 and the first gate driving voltage line VGLL1 in a plan view. In an embodiment, the logic circuit part LOG and the buffer circuit part BF may be defined to be spaced apart from each other along the first direction D1 at a selectable interval in a plan view.

The logic circuit part LOG and the buffer circuit part BF may be electrically connected. For example, the logic circuit part LOG and the buffer circuit part BF may be electrically connected through a transmission line.

In an embodiment, a global reset signal line SGRL and a third gate driving voltage line VGHL may be disposed between the logic circuit part LOG and the buffer circuit part BF.

The first stage STAGE1 may overlap the valley part VL in a plan view. For example, the first stage STAGE1 may overlap both a first inner surface IS1 and a second inner surface IS2 of the insulating layer defining the valley part VL. The emission driver 400 may overlap both the first inner surface IS1 and the second inner surface IS2 of the insulating layer defining the valley part VL. The valley part VL may pass through the emission driver 400. For example, the valley part VL may be defined inside the light emission driver 400.

In an embodiment, the first inner surface IS1 and the second inner surface IS2 may be disposed between the logic circuit part LOG and the buffer circuit part BF in a plan view. For example, the valley part VL may be disposed between the logic circuit part LOG and the buffer circuit part BF in a plan view. The valley part VL may overlap the transfer wire connecting the logic circuit part LOG and the buffer circuit part BF in a plan view. A portion of the valley part VL may overlap the global reset signal line SGRL and the third gate driving voltage line VGHL in a plan view.

FIGS. 7 to 14 are schematic plan views illustrating a stage included in the emission driver of FIG. 4 according to an embodiment. FIG. 15 is a schematic cross-sectional view illustrating a cross-section taken along line I-I' in FIG. 1 and a cross-section taken along line II-II' in FIG. 7.

Hereinafter, a structure of each layer of the display device DD including the emission driver 400 will be described in more detail with reference to FIGS. 1, 2, and 7 to 15.

Referring to FIGS. 1 and 7 to 15, the display device DD may include a substrate SUB, a first conductive layer CL1, a buffer layer BFR, an active layer ACT, a second conductive layer CL2, a third conductive layer CL3, a fourth conductive layer CL4, first to third inorganic insulating layers IL1, IL2, and IL3, first to third organic insulating layers OL1, OL2, and OL3, a light emitting device LD, and a capping layer CPL.

The substrate SUB may be an insulating substrate formed of a transparent or opaque material. In an embodiment, the substrate SUB may include glass. The display device DD may be a rigid display device. In an embodiment, the substrate SUB may include plastic. The display device DD may be a flexible display device.

Figure 8:
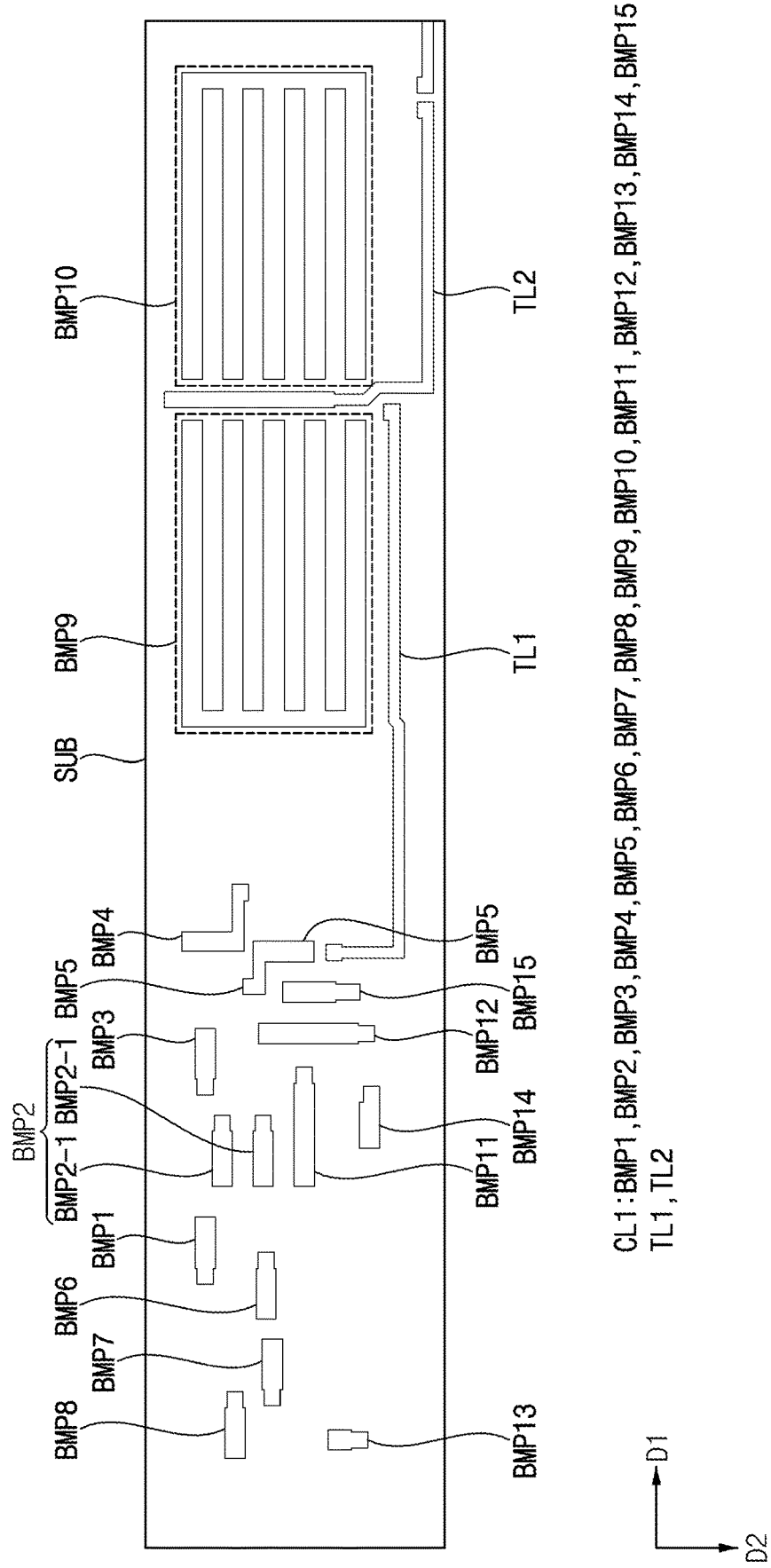

The first conductive layer CL1 may be disposed on the substrate SUB. In an embodiment, the first conductive layer CL1 may be formed of a metal, an alloy, a conductive metal oxide, a transparent conductive material, or the like within the spirit and the scope of the disclosure. As shown in FIG. 8, the first conductive layer CL1 may include first to fifteenth lower metal patterns BMP1, BMP2, BMP3, . . . , BMP14, BMP15, a first transmission line TL1, and a second transmission line TL2. The second lower metal pattern BMP2 may include a 2-1st lower metal pattern BMP2-1 and a 2-2nd lower metal pattern BMP2-2. In an embodiment, the first to fifteenth lower metal patterns BMP1, BMP2, BMP3, . . . , BMP14, BMP15, the first transfer line TL1, and the second transmission pattern may be spaced apart from each other. In an embodiment, each of the ninth lower metal pattern BMP9 and the tenth lower metal pattern BMP10 may be a set of sub lower metal patterns.

The buffer layer BFR may be disposed on the substrate SUB and cover the first conductive layer CL1. In an embodiment, the buffer layer BFR may be entirely disposed in the display area DA and the peripheral area PA on the substrate SUB. The buffer layer BFR may prevent diffusion of impurities such as oxygen, moisture, and the like to an upper portion of the substrate SUB through the substrate SUB. The buffer layer BFR may include an inorganic insulating material such as a silicon compound or a metal oxide. The buffer layer BFR may have a single-layer structure or a multi-layer structure including insulating layers.

Figure 9:
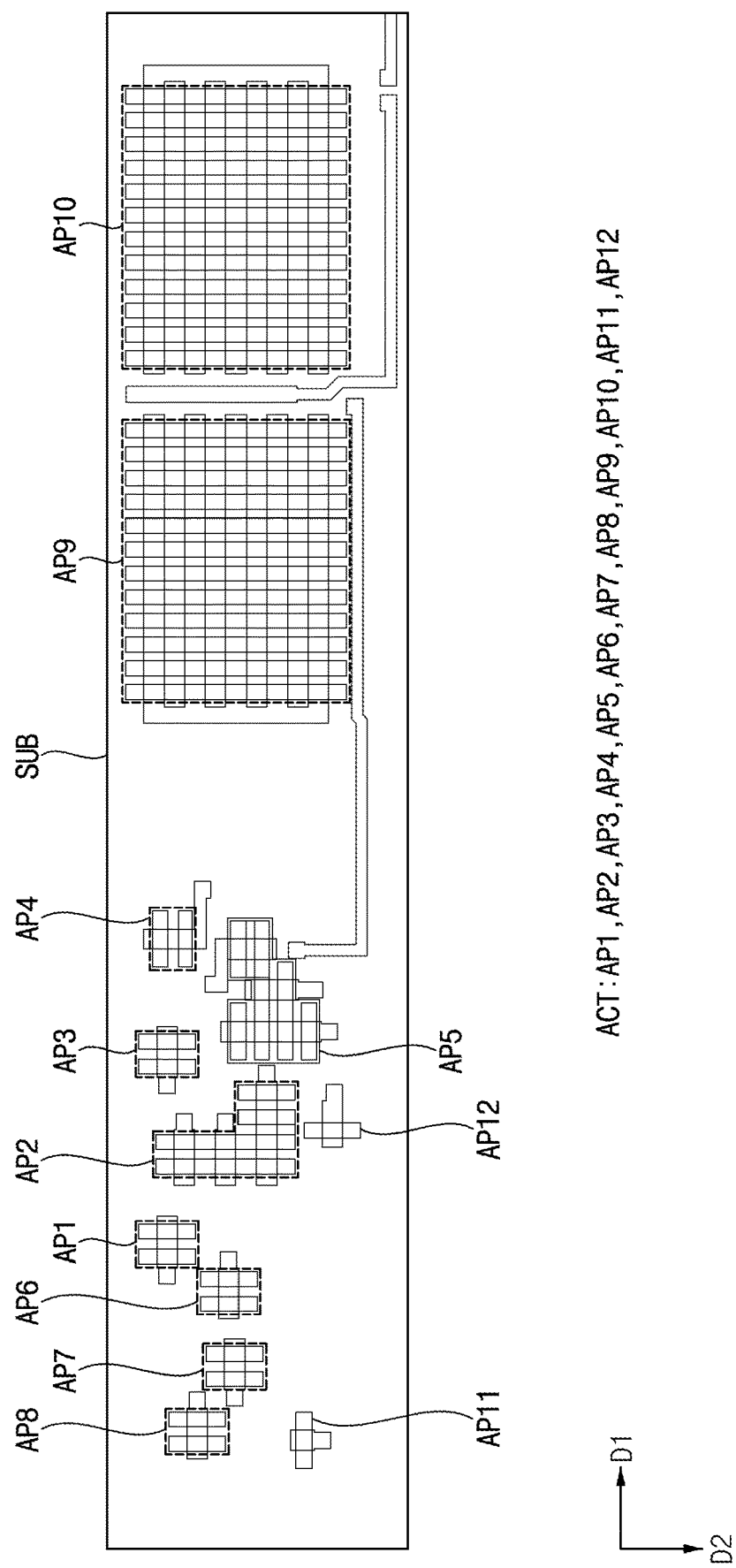

The active layer ACT may be disposed on the buffer layer BFR. In an embodiment, the active layer ACT may be formed of an oxide semiconductor material. As shown in FIG. 9, the active layer ACT may include first to twelfth active patterns AP1, AP2, AP3, . . . , AP11, and AP12. In an embodiment, the first to twelfth active patterns AP1. AP2, AP3, . . . , AP11, AP12 may be spaced apart from each other. In an embodiment, at least one active pattern among the first to twelfth active patterns AP1, AP2, AP3, . . . , AP11, AP12 may be a set of sub active patterns. For example, each of the ninth active pattern AP9 and the tenth active pattern AP10 may be a set of sub active patterns.

In an embodiment, the first active pattern AP1 may overlap the first lower metal pattern BMP1, the second active pattern AP2 may overlap the second lower metal pattern BMP2 and the eleventh lower metal pattern BMP12, the third active pattern AP3 may overlap the third lower metal pattern BMP3, the fourth active pattern AP4 may overlap the fourth lower metal pattern BMP4, the fifth active pattern AP5 may overlap the fifth lower metal pattern BMP5, the twelfth lower metal pattern BMP12, and the fifteenth lower metal pattern BMP15, the sixth active pattern AP6 may overlap the sixth lower metal pattern BMP6, the seventh active pattern AP7 may overlap the seventh lower metal pattern BMP7, the eighth active pattern AP8 may overlap the eighth lower metal pattern BMP8, the ninth active pattern AP9 may overlap the ninth lower metal pattern BMP9, the tenth active pattern AP10 may overlap the tenth lower metal pattern BMP10, the eleventh active pattern AP11 may overlap the thirteenth lower metal pattern BMP13, and the twelfth active pattern AP12 may overlap the fourteenth lower metal pattern BMP14.

The first inorganic insulating layer IL1 may be disposed on the buffer layer BFR, and cover the active layer ACT. In an embodiment, the first inorganic insulating layer IL1 may be entirely formed in the display area DA and the peripheral area PA.

Figure 10:
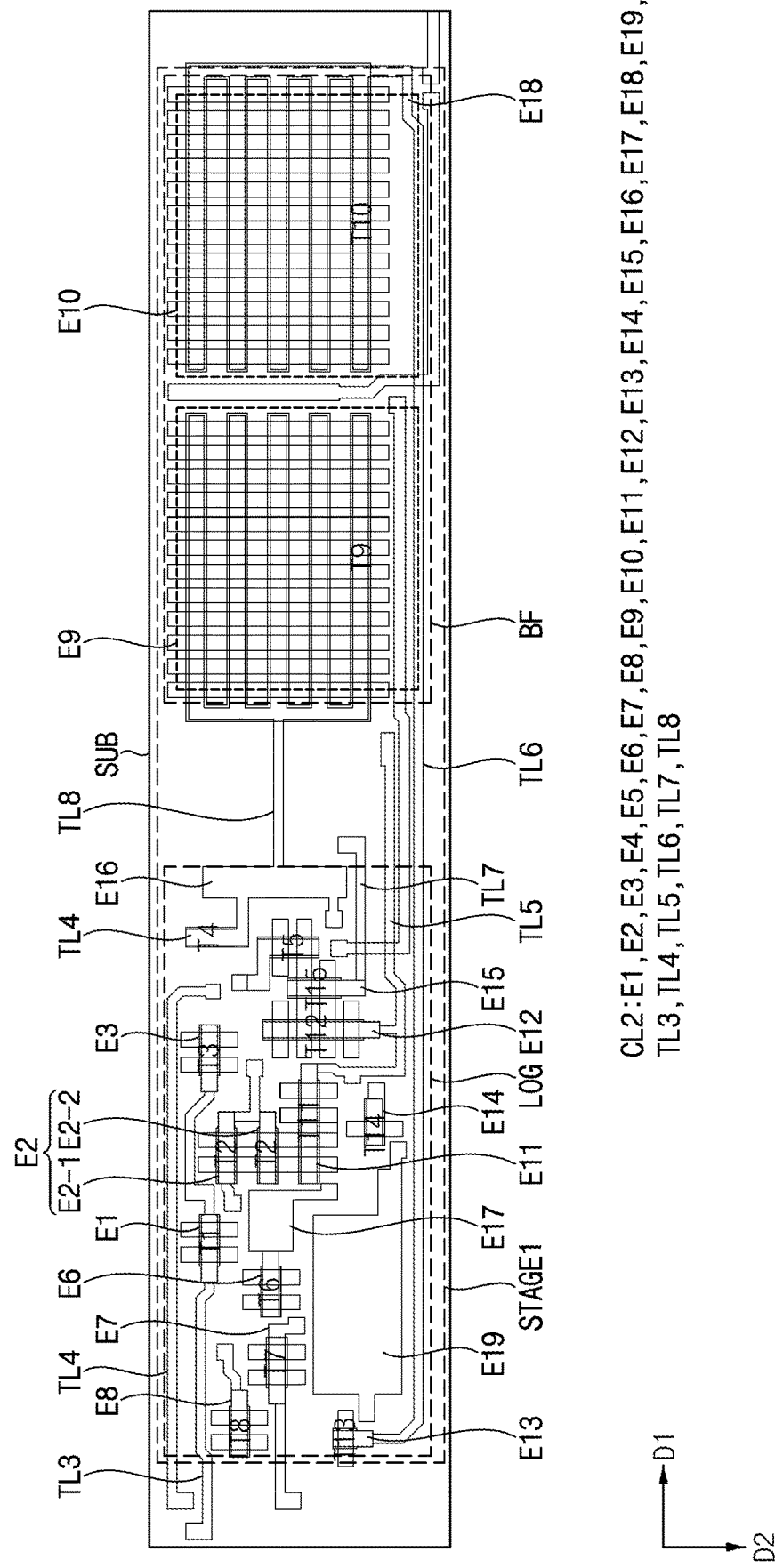

The second conductive layer CL2 may be formed on the first inorganic insulating layer IL1. In an embodiment, the second conductive layer CL2 may include a metal, an alloy, a conductive metal oxide, a transparent conductive material, or the like within the spirit and the scope of the disclosure. As shown in FIG. 10, the second conductive layer CL2 may include first to nineteenth gate electrodes E1, E2, E3, . . . , E18, and E19 and third to eighth transmission lines TL4, TL5, TL6, TL7, TL8. The second gate electrode E2 may include a 2-1st gate electrode E2-1 and a 2-2nd gate electrode E2-2. In an embodiment, the first to nineteenth gate electrodes E1, E2, E3, . . . , E18, and E19 may be spaced apart from each other.

The first gate electrode E1 may be disposed on the first active pattern AP1 and may overlap the first active pattern AP1. The first gate electrode E1 and the first active pattern AP1 may constitute the first transistor T1.

The second gate electrode E2 may be disposed on the second active pattern AP2 and may overlap the second active pattern AP2. The second gate electrode E2 and the second active pattern AP2 may constitute the second transistor T2. The second transistor T2 may have a dual-gate structure.

The third gate electrode E3 may be disposed on the third active pattern AP3 and may overlap the third active pattern AP3. The third gate electrode E3 and the third active pattern AP3 may constitute the third transistor T3.

The fourth gate electrode E4 may be disposed on the fourth active pattern AP4 and may overlap the fourth active pattern AP4. The fourth gate electrode E4 and the fourth active pattern AP4 may constitute the fourth transistor T4.

The fifth gate electrode E5 may be disposed on the fifth active pattern AP5 and may overlap the fifth active pattern AP5. The fifth gate electrode E5 and the fifth active pattern AP5 may constitute the fifth transistor T5.

The sixth gate electrode E6 may be disposed on the sixth active pattern AP6 and may overlap the sixth active pattern AP6. The sixth gate electrode E6 and the sixth active pattern AP6 may constitute the sixth transistor T6.

The seventh gate electrode E7 may be disposed on the seventh active pattern AP7 and may overlap the seventh active pattern AP7. The seventh gate electrode E7 and the seventh active pattern AP7 may constitute the seventh transistor T7.

The eighth gate electrode E8 may be disposed on the eighth active pattern AP8 and may overlap the eighth active pattern AP8. The eighth gate electrode E8 and the eighth active pattern AP8 may constitute the eighth transistor T8.

The ninth gate electrode E9 may be disposed on the ninth active pattern AP9 and may overlap the ninth active pattern AP9. The ninth gate electrode E9 and the ninth active pattern AP9 may constitute the ninth transistor T9.

The tenth gate electrode E10 may be disposed on the tenth active pattern AP10 and may overlap the tenth active pattern AP10. The tenth gate electrode E10 and the tenth active pattern AP10 may constitute the tenth transistor T10.

The eleventh gate electrode E11 may be disposed on the second active pattern AP2 and may overlap the second active pattern AP2. The eleventh gate electrode E11 and the second active pattern AP2 may constitute the second stress relieving transistor T11.

The twelfth gate electrode E12 may be disposed on the fifth active pattern AP5 and may overlap the fifth active pattern AP5. The twelfth gate electrode E12 and the fifth active pattern AP5 may constitute the first stress relieving transistor T12.

The thirteenth gate electrode E13 may be disposed on the eleventh active pattern AP11 and may overlap the eleventh active pattern AP11. The thirteenth gate electrode E13 and the eleventh active pattern AP11 may constitute the thirteenth transistor T13.

The fourteenth gate electrode E14 may be disposed on the twelfth active pattern AP12 and may overlap the twelfth active pattern AP12. The fourteenth gate electrode E14 and the twelfth active pattern AP12 may constitute the fourteenth transistor T14.

The fifteenth gate electrode E15 may be disposed on the fifth active pattern AP5 and may overlap the fifth active pattern AP5. The fifteenth gate electrode E15 and the fifth active pattern AP5 may constitute the reset transistor T15.

The third transmission line TL3 may be connected to the first gate electrode E1. The fifth transmission line TL5 may be connected to the eleventh gate electrode E11 and the twelfth gate electrode E12. The sixth transmission line TL6 may be connected to the thirteenth gate electrode E13 and the eighteenth gate electrode E18. The seventh transmission line TL7 may be connected to the fifteenth gate electrode E15. The eighth transmission line TL8 may be connected to the sixteenth gate electrode E16 and the ninth gate electrode E9. The fourth transmission line TL4 may be spaced apart from the first to nineteenth gate electrodes E1, E2. E3, . . . , E18, and E19.

The second inorganic insulating layer IL2 may cover the second conductive layer CL2 and may be disposed on the first inorganic insulating layer IL1. In an embodiment, the second inorganic insulating layer IL2 may be entirely formed in the display area DA and the peripheral area PA.

Figure 11:
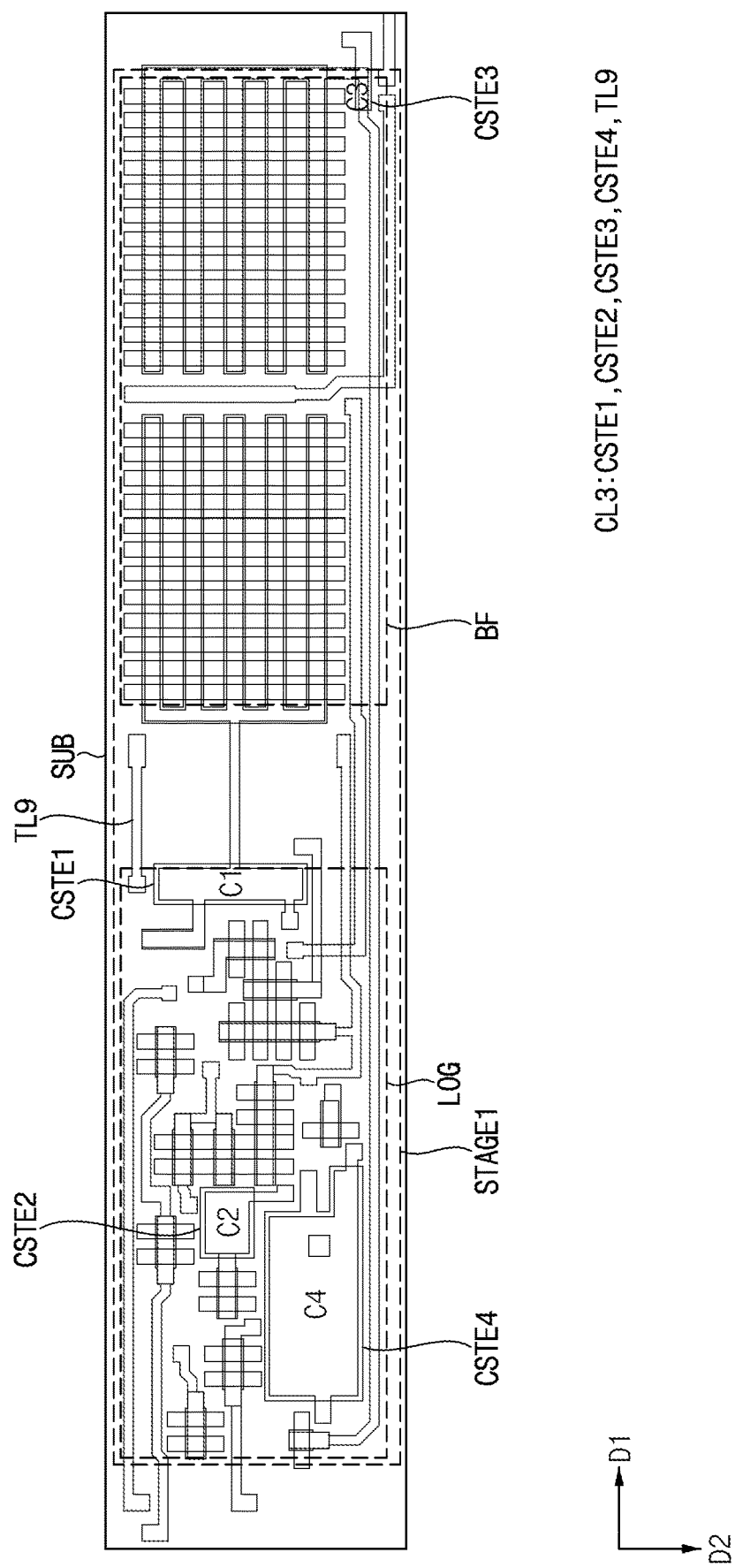
Figure 12:
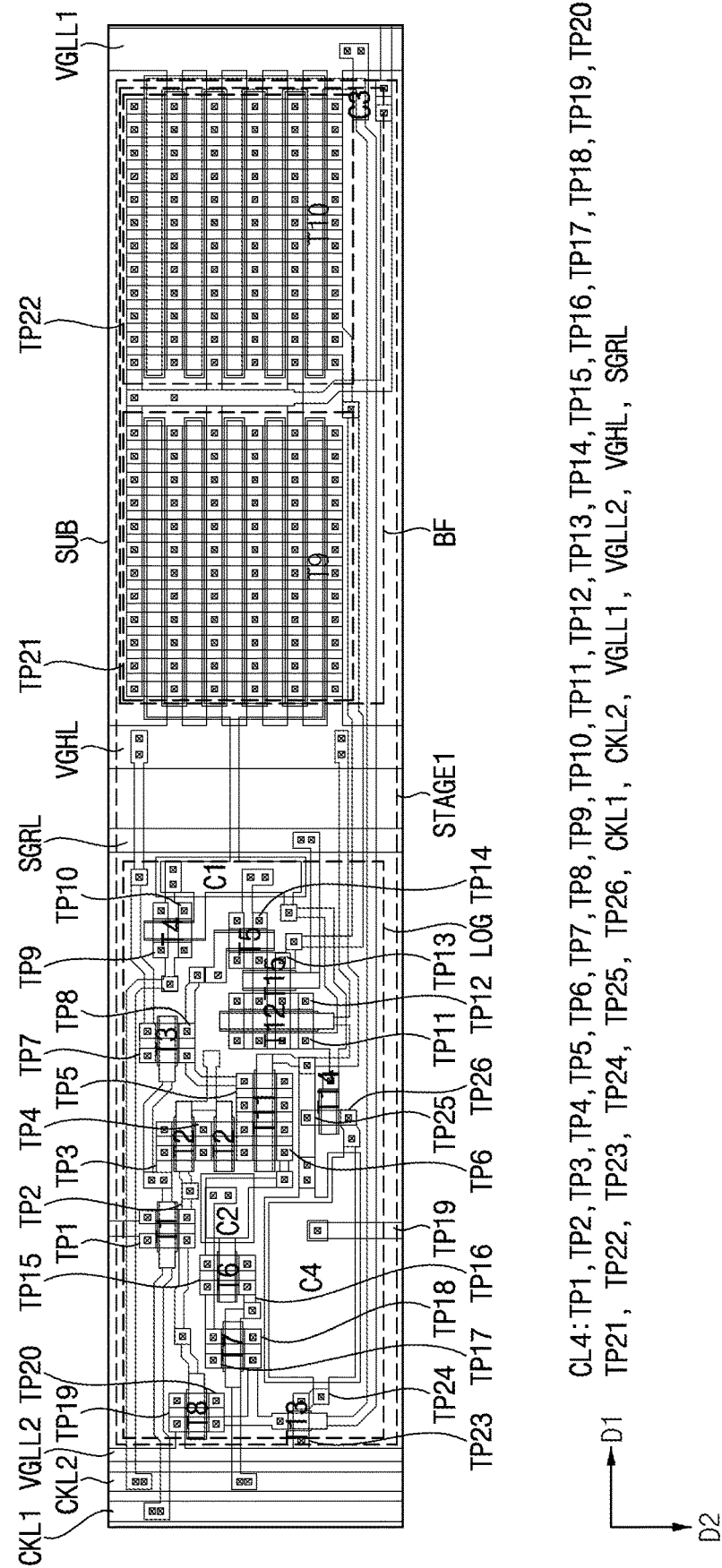

The third conductive layer CL3 may be disposed on the second inorganic insulating layer IL2. In an embodiment, the third conductive layer CL3 may include a metal, an alloy, a conductive metal oxide, a transparent conductive material, or the like within the spirit and the scope of the disclosure. As shown in FIG. 11, the third conductive layer CL3 may include first to fourth capacitor electrodes CSTE1, CSTE2, CSTE3, and CSTE4 and a ninth transmission line TL9. In an embodiment, the first to fourth capacitor electrodes CSTE1, CSTE2, CSTE3, and CSTE4 and the eighth transmission line TL8 may be spaced apart from each other.

The first capacitor electrode CSTE1 may be disposed on the sixteenth gate electrode E16 and may overlap the sixteenth gate electrode E16. The sixteenth gate electrode E16 and the first capacitor electrode CSTE1 may constitute a first capacitor C1.

The second capacitor electrode CSTE2 may be disposed on the seventeenth gate electrode E17 and may overlap the seventeenth gate electrode E17. The seventeenth gate electrode E17 and the second capacitor electrode CSTE2 may constitute a second capacitor C2.

The third capacitor electrode CSTE3 may be disposed on the eighteenth gate electrode E18 and may overlap the eighteenth gate electrode E18. The eighteenth gate electrode E18 and the third capacitor electrode CSTE3 may configure a third capacitor C3.

The fourth capacitor electrode CSTE4 may be disposed on the nineteenth gate electrode E19 and may overlap the nineteenth gate electrode E19. The nineteenth gate electrode E19 and the fourth capacitor electrode CSTE4 may constitute a fourth capacitor C4.

In an embodiment, the first transistor T1, the second transistor T2, the third transistor T3, the fourth transistor T4, the fifth transistor T5, the sixth transistor T6, the seventh transistor T7, the eighth transistor T8, the second stress relieving transistor T11, the first stress relieving transistor T12, the thirteenth transistor T13, the fourteenth transistor T14, the first capacitor C1, the second capacitor C2, and the fourth capacitor C4 may constitute the logic circuit part LOG of the first stage STAGE1.

In an embodiment, the ninth transistor T9, the tenth transistor T10, and the third capacitor C3 may configure the buffer circuit part BF of the first stage STAGE1. The logic circuit part LOG and the buffer circuit part BF may be separated from each other by the selectable interval in a plan view. The logic circuit part LOG and the buffer circuit part BF may be electrically connected through the eighth transmission line TL8.

The third inorganic insulating layer IL3 may cover the second conductive layer CL2 and may be disposed on the second inorganic insulating layer IL2. The third inorganic insulating layer IL3 may be entirely formed in the display area DA and the peripheral area PA.

The fourth conductive layer CL4 may be disposed on the third inorganic insulating layer IL3. The fourth conductive layer CL4 may include a metal, an alloy, a conductive metal oxide, a transparent conductive material, or the like within the spirit and the scope of the disclosure. As shown in FIG. 11, the fourth conductive layer CL4 may include first to twenty-sixth transmission patterns TP1, TP2, TP3, . . . , TP25, TP26, the first clock line CKL1, the second clock line CKL2, the first gate driving voltage line VGLL1, the second gate driving voltage line VGLL2, the third gate driving voltage line VGHL, and the global reset signal line SGRL.

The first transmission pattern TP1 and the second transmission pattern TP2 may be connected to the first active pattern AP1, the third to sixth transmission patterns TP3, TP4, TP5, and TP6 may be connected to the second active pattern AP2, the seventh transmission pattern TP7 and the eighth transmission pattern TP8 may be connected to the third active pattern AP3, the ninth transmission pattern TP9 and the tenth transmission pattern TP10 may be connected to the fourth active pattern AP4, the eleventh to fourteenth transmission patterns TP11, TP12, TP13, and TP14 may be connected to the fifth active pattern AP5, and the fifteenth transmission pattern TP15 and the sixteenth transmission pattern TP16 may be connected to the sixth active pattern AP6, the seventeenth transmission pattern TP17 and the eighteenth transmission pattern TP18 may be connected to the seventh active pattern AP7, and the nineteenth transmission pattern TP19 and the twentieth transmission pattern TP20 may be connected to the eighth active pattern AP8, the twenty-first transmission pattern TP21 may be connected to the ninth active pattern AP9, and the twenty-second transmission pattern TP22 may be connected to the tenth active pattern. AP10, the twenty-third transmission pattern TP23 and the twenty-fourth transmission pattern TP24 may be connected to the eleventh active pattern AP11, and the twenty-fifth transmission pattern TP25 and the twenty-sixth transmission pattern TP26 may be connected to the twelfth active pattern AP12.

The first clock line CKL1 may be connected to the first transistor T1 through the third transmission line TL3. A first clock signal (for example, the clock signal CLK1 of FIG. 5) may be transmitted to the first transistor T1 through the first clock line CKL1 and the first gate electrode E1.

The second clock line CKL2 may be connected to the fourth transistor T4 through the fourth transmission line TL4. Also, the second clock line CKL2 may be connected to the sixth transistor T6 and the seventh transistor T7. A second clock signal (for example, the clock signal CLK2 of FIG. 5) may be transmitted to the fourth transistor T4 through the second clock line CKL2 and the fourth transmission line TL4, may be transmitted to the sixth transistor T6 through the second clock line CKL2 and the sixth gate electrode E6, and may be transmitted to the seventh transistor T7 through the second clock line CKL2 and the seventh gate electrode E7.

The first gate driving voltage line VGLL1 may be connected to the third capacitor C3. The first low gate voltage VGL1 may be transmitted to the third capacitor C3 through the first gate driving voltage line VGLL1 and the eighteenth gate electrode E18.

The second gate driving voltage line VGLL2 may be connected to the eighth transistor T8 and the thirteenth transistor T13. The second low gate voltage VGL2 may be transmitted to the eighth transistor T8 and the thirteenth transistor T13 through the second gate driving voltage line VGLL2.

The third gate driving voltage line VGHL may be connected to the second stress relieving transistor T11 through the eighth transfer line TL8. The high gate voltage VGH may be transmitted to the second stress relieving transistor T11 through the third gate driving voltage line VGHL, the eighth transmission line TL8 and the eleventh gate electrode E11.

The global reset signal line SGRL may be connected to the reset transistor T15 through the seventh transfer line TL7. A global reset signal (for example, the global reset signal SGR of FIG. 5) may be transmitted to the reset transistor T15 through the global reset signal line SGRL, the seventh transmission line TL7 and the fifteenth gate electrode E15.

As shown in FIG. 15, a pixel transistor TR may be disposed in the display area DA. The pixel transistor TR may be at least one of the first to fifth pixel transistors PTX1, PTX2, PTX3, PTX4, and PTX5 of FIG. 3. Hereinafter, for convenience of description, only one pixel transistor TR disposed in the display area DA will be described.

The pixel transistor TR may include a pixel active pattern PACT, a first pixel gate electrode PGAT1, a second pixel gate electrode PGAT2, a first connection electrode CE1, and a second connection electrode CE2.

The first pixel active pattern PACT may be included in the active layer ACT. For example, the first pixel active pattern PACT may be formed through a same process as the first to twelfth active patterns AP1, AP2, AP3, . . . , AP11, AP12. The first pixel active pattern PACT may be disposed on a same layer and include a same material or a similar material as the first to twelfth active patterns AP1, AP2, AP3, . . . , AP11, AP12.

The first pixel gate electrode PGAT1 may be included in the second conductive layer CL2. For example, the first pixel gate electrode PGAT1 may be formed through a same process as the first to nineteenth gate electrodes E1, E2, E3, . . . , E18, E19 and the third to eighth transmission lines TL4, TL5, TL6, TL7, and TL8. The first pixel gate electrode PGAT1 may be disposed on a same layer and include a same material or a similar material as the first to nineteenth gate electrodes E1, E2, E3, . . . , E18, E19 and the third to eighth transfer lines TL4, TL5, TL6, TL7, TL8. The first pixel gate electrode PGAT1 may overlap the pixel active pattern PACT.

The second pixel gate electrode PGAT2 may be included in the third conductive layer CL3. For example, the second pixel gate electrode PGAT2 may be formed through a same process as the first to fourth capacitor electrodes CSTE1, CSTE2, CSTE3, and CSTE4 and the ninth transmission line TL9. The second pixel gate electrode PGAT2 may be disposed on a same layer and include a same material or a similar material as the first to fourth capacitor electrodes CSTE1, CSTE2, CSTE3, and CSTE4 and the ninth transmission line TL9. The second pixel gate electrode PGAT2 may overlap the first pixel gate electrode PGAT1 and the pixel active pattern PACT.

The first connection electrode CE1 and the second connection electrode CE2 may be included in the fourth conductive layer CL4. For example, the first connection electrode CE1 and the second connection electrode CE2 may be formed through a same process as the first to twentieth transmission patterns TP1, TP2, TP3, . . . , TP19, TP20, the first clock line CKL1, the second clock line CKL2, the first gate driving voltage line VGLL1, the second gate driving voltage line VGLL2, the third gate driving voltage line VGHL, and the global reset signal line SGRL.

The first connection electrode CE1 and the second connection electrode CE2 may be disposed on a same layer and include a same material or a similar material as the first to twentieth transfer patterns TP1, TP2, TP3, . . . , TP19, TP20, the first clock line CKL1, the second clock line CKL2, the first gate driving voltage line VGLL1, the second gate driving voltage line VGLL2, the third gate driving voltage line VGHL, and the global reset signal line SGRL. The first connection electrode CE1 and the second connection electrode CE2 may be connected to the pixel active pattern PACT.

The first organic insulating layer OL1 may cover the fourth conductive layer CL4 and may be disposed on the third inorganic insulating layer IL3. The first organic insulating layer OL1 may be disposed in the display area DA and the peripheral area PA. A portion of the first organic insulating layer OL1 may be removed in the peripheral area PA. Accordingly, the first organic insulating layer OL1 may have a first valley portion VL1. The first valley portion VL1 may be defined from an inner surface of the first organic insulating layer OL1.

Figure 13:
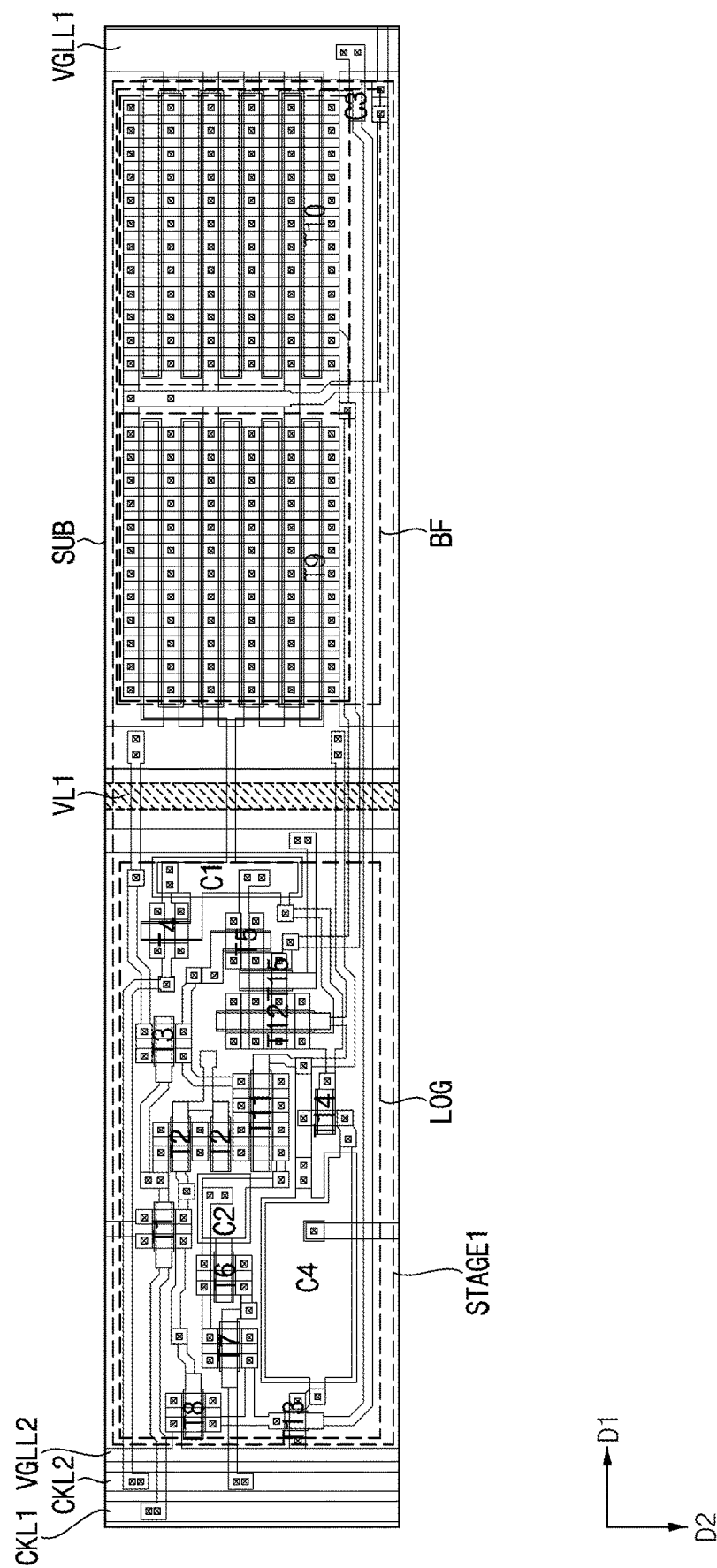

In an embodiment, as shown in FIG. 13, the first valley portion VL1 may be disposed between the logic circuit part LOG and the buffer circuit part BF in a plan view. For example, the inner surface of the first organic insulating layer OL1 defining the first valley portion VL1 may be disposed between the logic circuit part LOG and the buffer circuit part BF in a plan view, and may be spaced apart from the logic circuit part LOG and the buffer circuit part BF. The first valley portion VL1 may overlap the eighth transmission line TL8 electrically connecting the logic circuit part LOG and the buffer circuit part BF in a plan view.

A connection pattern CP may be disposed on the first organic insulating layer OL1. The connection pattern CP may contact the second connection electrode CE2. The second organic insulating layer OL2 may be disposed on the connection pattern CP. A portion of the second organic insulating layer OL2 in the peripheral area PA may be removed. Accordingly, the second organic insulating layer OL2 may have the second valley portion VL2. The second valley portion VL2 may be defined from an inner surface of the second organic insulating layer OL2. The valley part VL may be defined by spatially connecting the first valley portion VL1 and the second valley portion VL2.

Figure 14:
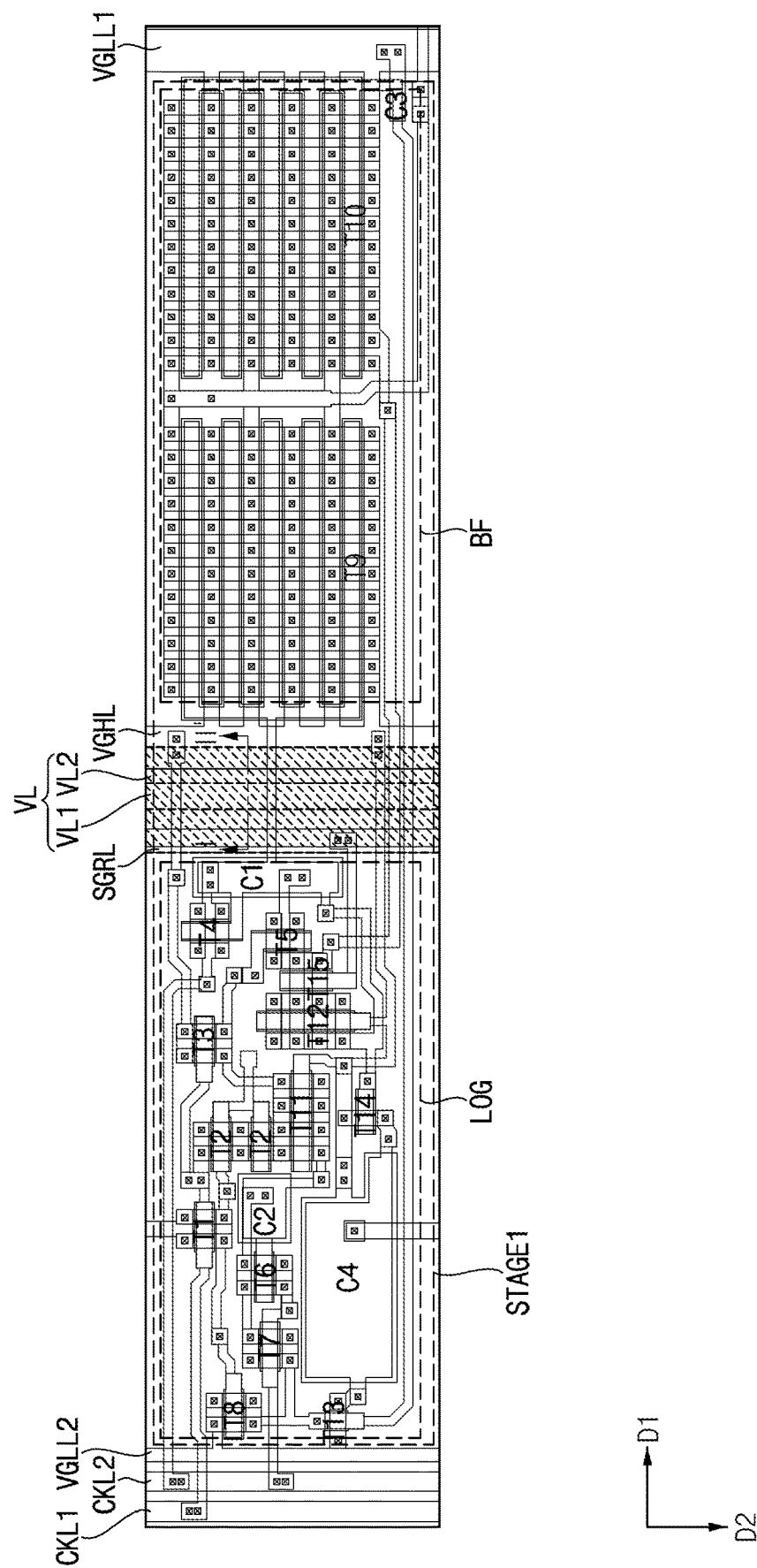
Figure 15:
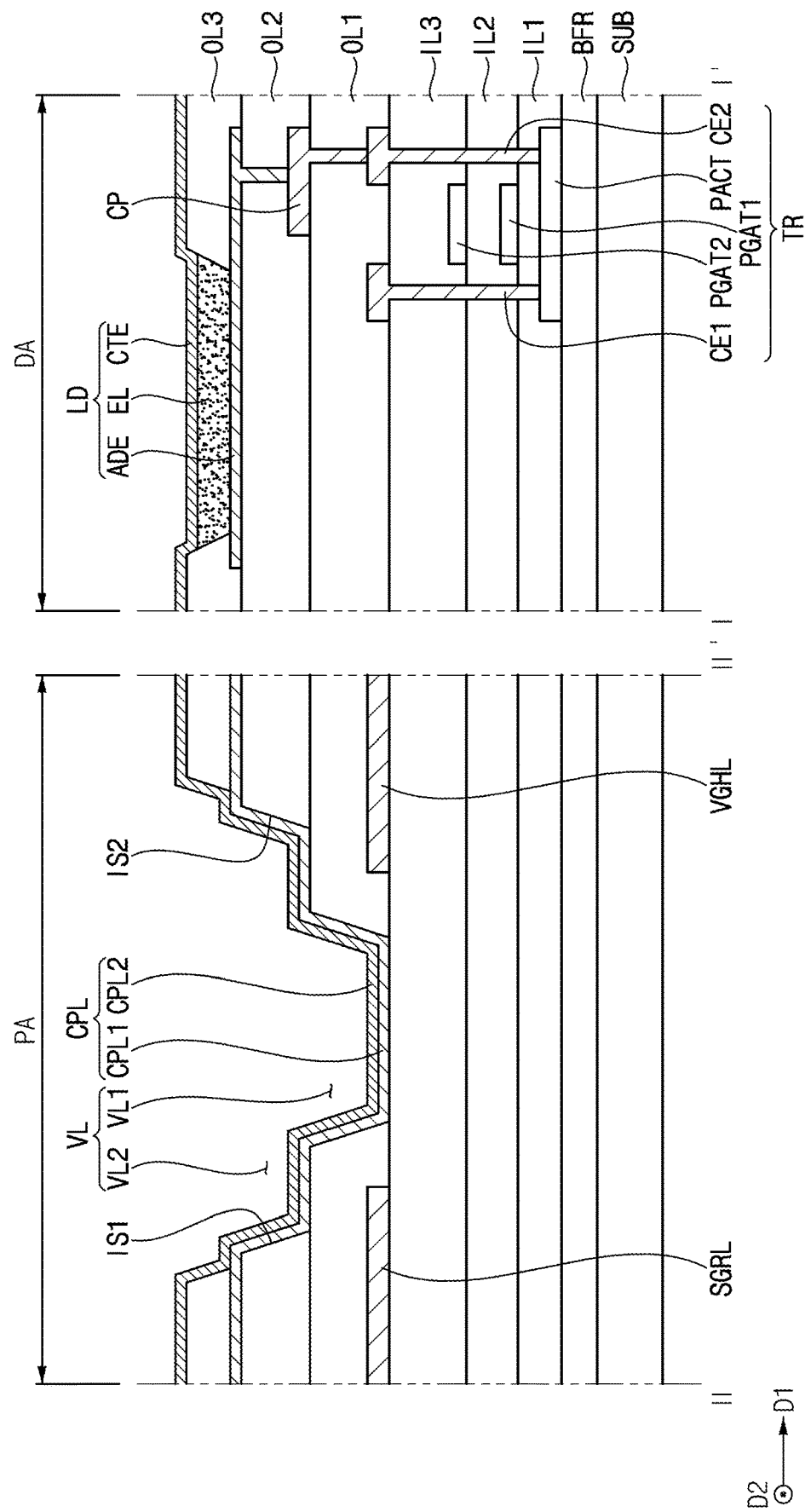
FIG. 15 is a schematic cross-sectional view illustrating a cross-section taken along line I-I' in FIG. 1 and a cross-section taken along line II-II' in FIG. 7.

In an embodiment, as shown in FIG. 14, the second valley portion VL2 may be disposed between the logic circuit part LOG and the buffer circuit part BF in a plan view. For example, the inner surface of the second organic insulating layer OL2 defining the second valley portion VL2 may be disposed between the logic circuit part LOG and the buffer circuit part BF in a plan view, and may be spaced apart from the logic circuit part LOG and the buffer circuit part BF. The second valley portion VL2 may overlap the eighth transmission line TL8 electrically connecting the logic circuit part LOG and the buffer circuit part BF in a plan view. Accordingly, the valley part VL may overlap the eighth transmission line TL8 electrically connecting the logic circuit part LOG and the buffer circuit part BF in a plan view.

In an embodiment, an area and a width of the first valley portion VL1 and the second valley portion VL2 defining the valley part VL may be different from each other. For example, a width of the first valley portion VL1 may be smaller than a width of the second valley portion VL2. As shown in FIG. 15, the first inner surface IS1 and the second inner surface IS2 of the insulating layer defining the valley part VL may have a step. The inner surface of the first organic insulating layer OL1 defining the first valley portion VL1 and the inner surface of the second organic insulating layer OL2 defining the second valley portion VL2 may be displaced from each other.

As shown in FIG. 15, the light emitting device LD may be disposed in the display area DA on the second organic insulating layer OL2. The light emitting device LD may be the organic light emitting diode OLED of FIG. 3. The light emitting device LD may contact the connection pattern CP and be electrically connected to the pixel transistor TR. The light emitting device LD may include an anode electrode ADE, an emission layer EL, and a cathode electrode CTE.

The anode electrode ADE may correspond to the first terminal of the organic light emitting diode OLED of FIG. 3. The anode electrode ADE may be formed of a metal, an alloy, a conductive metal oxide, a transparent conductive material, or the like within the spirit and the scope of the disclosure. Examples of materials that can be used as the anode electrode ADE may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like within the spirit and the scope of the disclosure.

The third organic insulating layer OL3 may be disposed on the second organic insulating layer OL2. The third organic insulating layer OL3 may cover a portion of the anode electrode ADE. For example, the third organic insulating layer OL3 may have a pixel opening exposing a portion of an upper surface of the anode electrode ADE. Accordingly, the third organic insulating layer OL3 may define the pixel PX. In an embodiment, in the peripheral area PA, a portion of the third organic insulating layer OL3 may be removed to correspond to the valley part VL.

The emission layer EL may be disposed on the anode electrode ADE exposed by the third organic insulating layer OL3. The common electrode CTE may be disposed on the emission layer EL. The common electrode CTE may correspond to the second terminal of the organic light emitting diode OLED of FIG. 3.

The cathode electrode CTE may be formed of a metal, an alloy, a conductive metal oxide, a transparent conductive material, or the like within the spirit and the scope of the disclosure. Examples of materials that can be used as the cathode electrode CTE may include silver (Ag), an alloy containing silver, molybdenum (Mo), an alloy containing molybdenum, aluminum (Al), and an alloy containing aluminum. Alloy, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like within the spirit and the scope of the disclosure. These may be used alone or in combination with each other.

In an embodiment, the valley part VL may be capped by the capping layer CPL. In an embodiment, the capping layer CPL may include a first capping layer CPL1 and a second capping layer CPL2. The first capping layer CPL1 may be formed through a same process as the anode electrode ADE. The first capping layer CPL1 may include a same material or a similar material as the anode electrode ADE. The second capping layer PCL2 may be disposed on the first capping layer CPL2 and may be formed through a same process as the cathode electrode CTE. The second capping layer CPL2 may include a same material or a similar material as the cathode electrode CTE.

Figure 16:
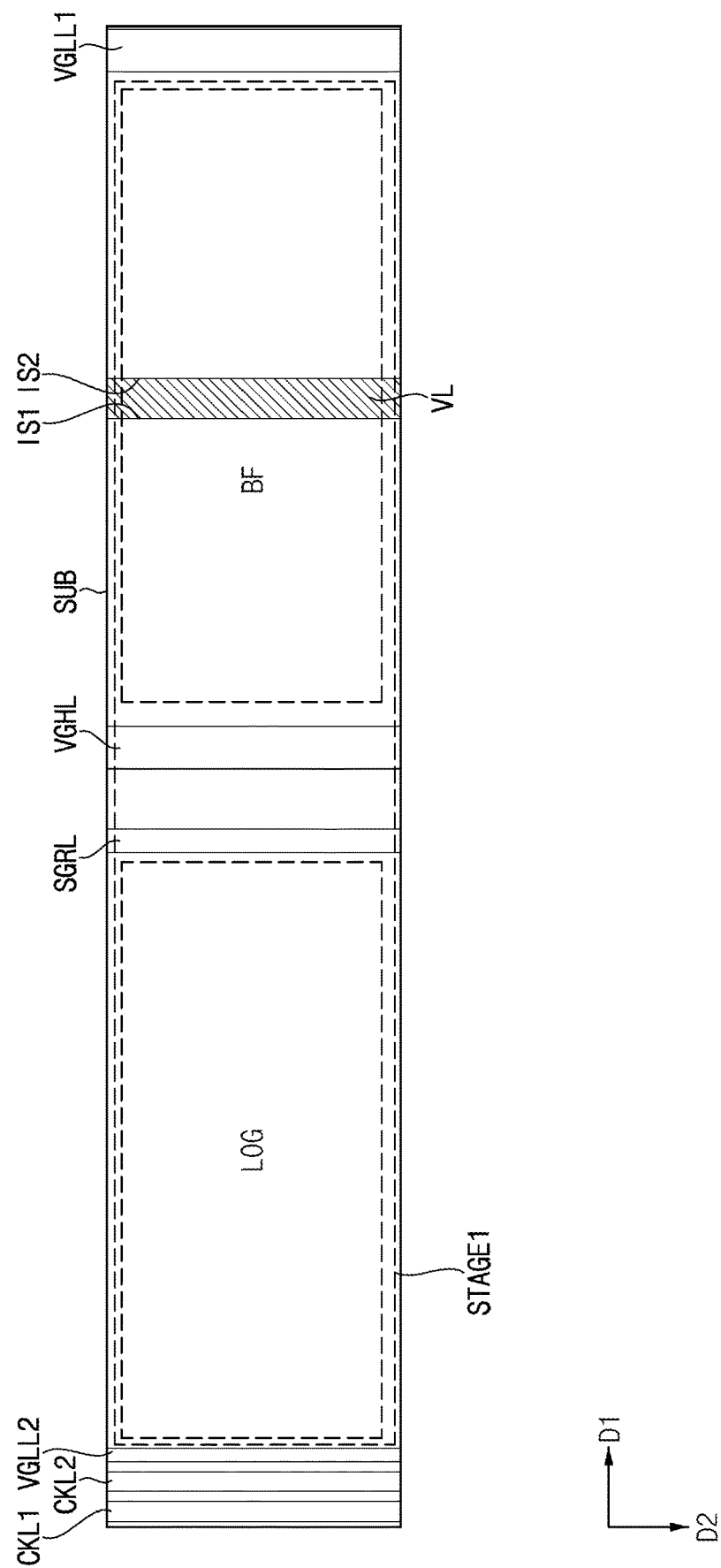
FIGS. 16 to 21 are views illustrating a stage included in the emission driver of FIG. 4 according to other embodiments.
Figure 17:
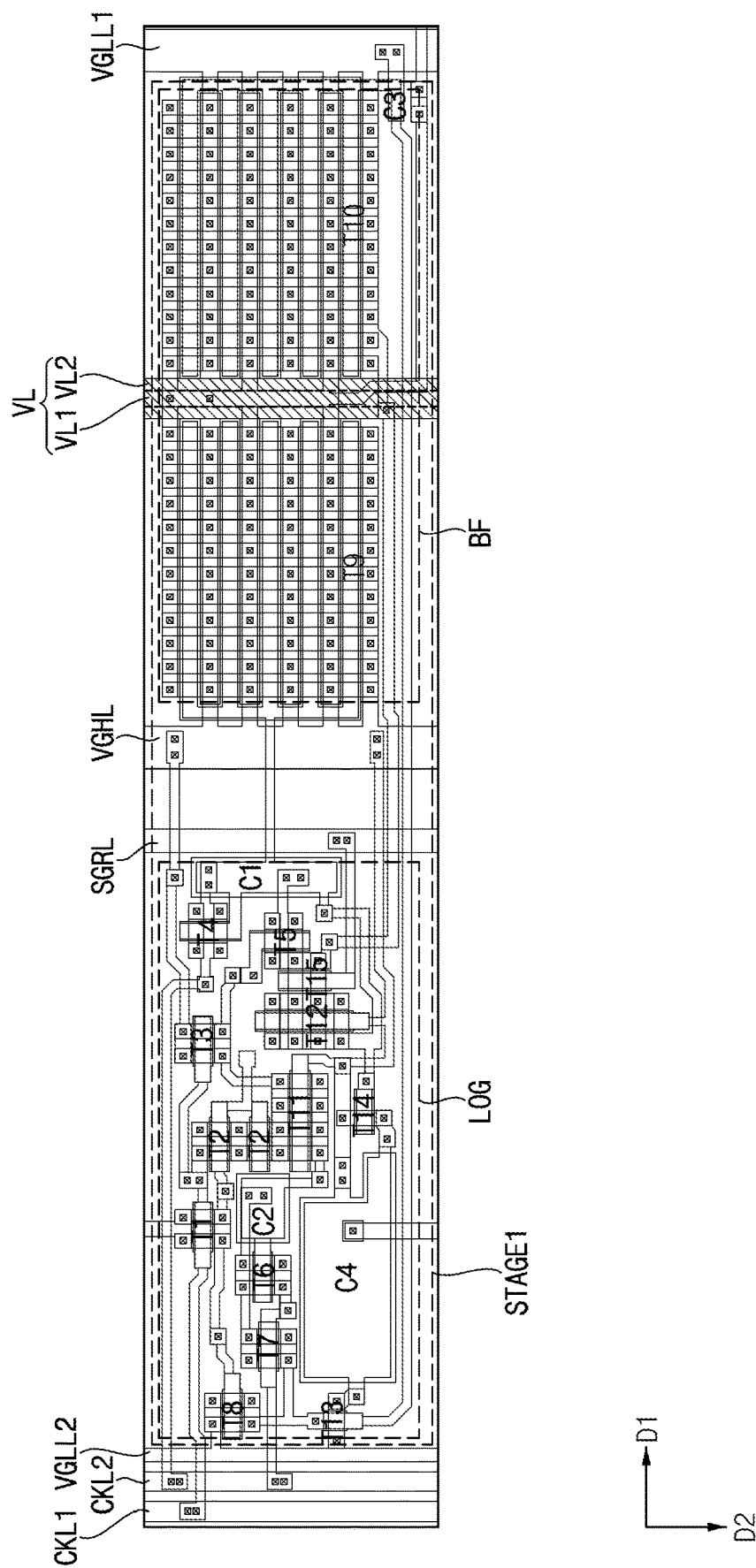

FIGS. 16 to 21 are views illustrating a stage included in the emission driver of FIG. 4 according to other embodiments. For example, FIGS. 16 and 18 to 21 may correspond to a schematic plan view of FIG. 6. FIG. 17 may correspond to a plan view of FIG. 7.

Referring to FIGS. 16 to 21, a position of the valley part VL in the emission driver 400 may be variously modified. For example, if the valley part VL is disposed inside the emission driver 400, the position where the valley part VL passes the emission driver 400 may be determined in various ways.

In an embodiment, as shown in FIG. 16, the valley part VL may overlap the buffer circuit part BF and be spaced apart from the logic circuit part LOG in a plan view. For example, the first inner surface IS1 and the second inner surface IS2 may overlap the buffer circuit part BF in a plan view.

Referring further to FIG. 17, the first inner surface IS1 and the second inner surface IS2 may be disposed between the ninth transistor T9 and the tenth transistor T10 of FIG. 3 in a plan view. For example, the valley part VL may be disposed between the ninth transistor T9 and the tenth transistor T10 in a plan view.

Figure 18:
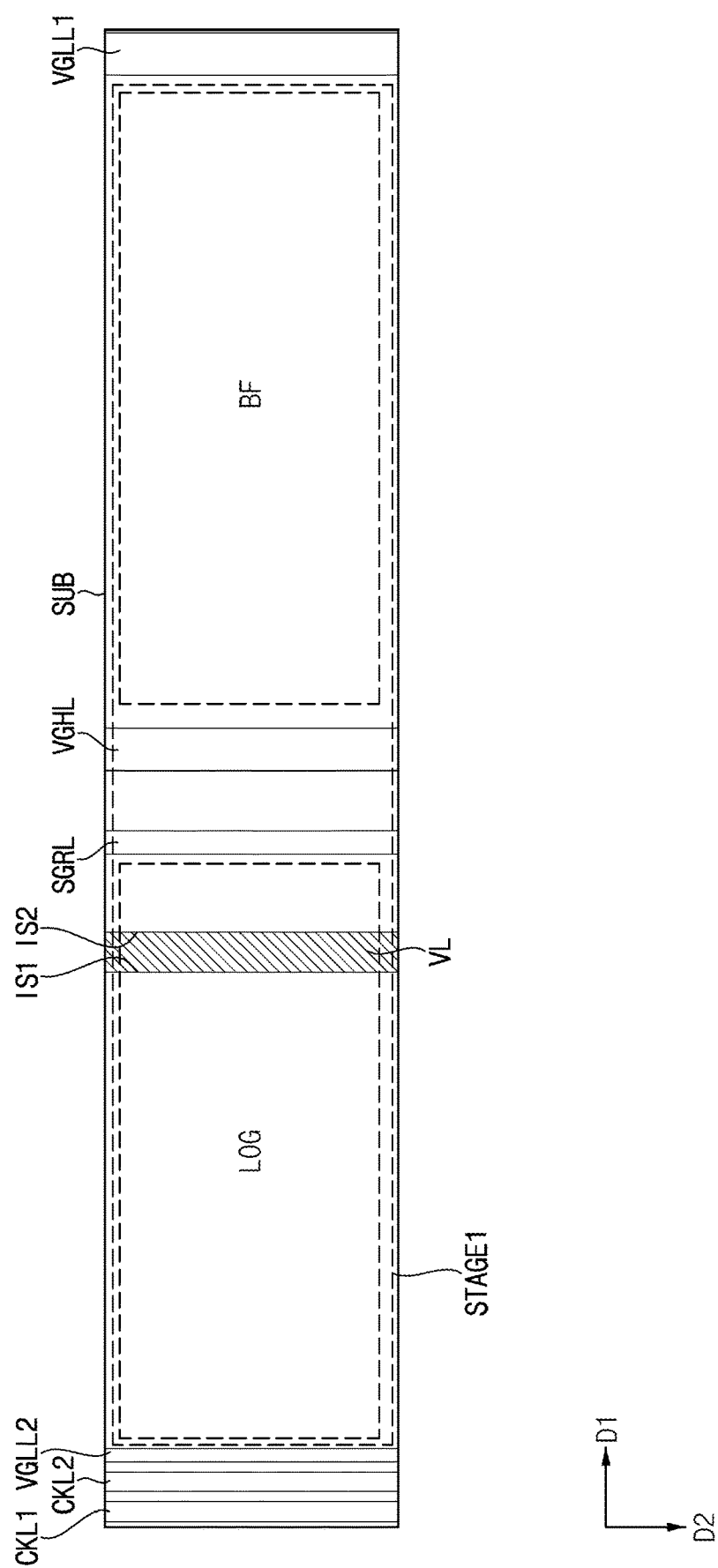

In an embodiment, as shown in FIG. 18, the valley part VL may overlap the logic circuit part LOG and may be spaced apart from the buffer circuit part BF in a plan view. For example, the first inner surface IS1 and the second inner surface IS2 may overlap the logic circuit part LOG in a plan view.

Figure 19:
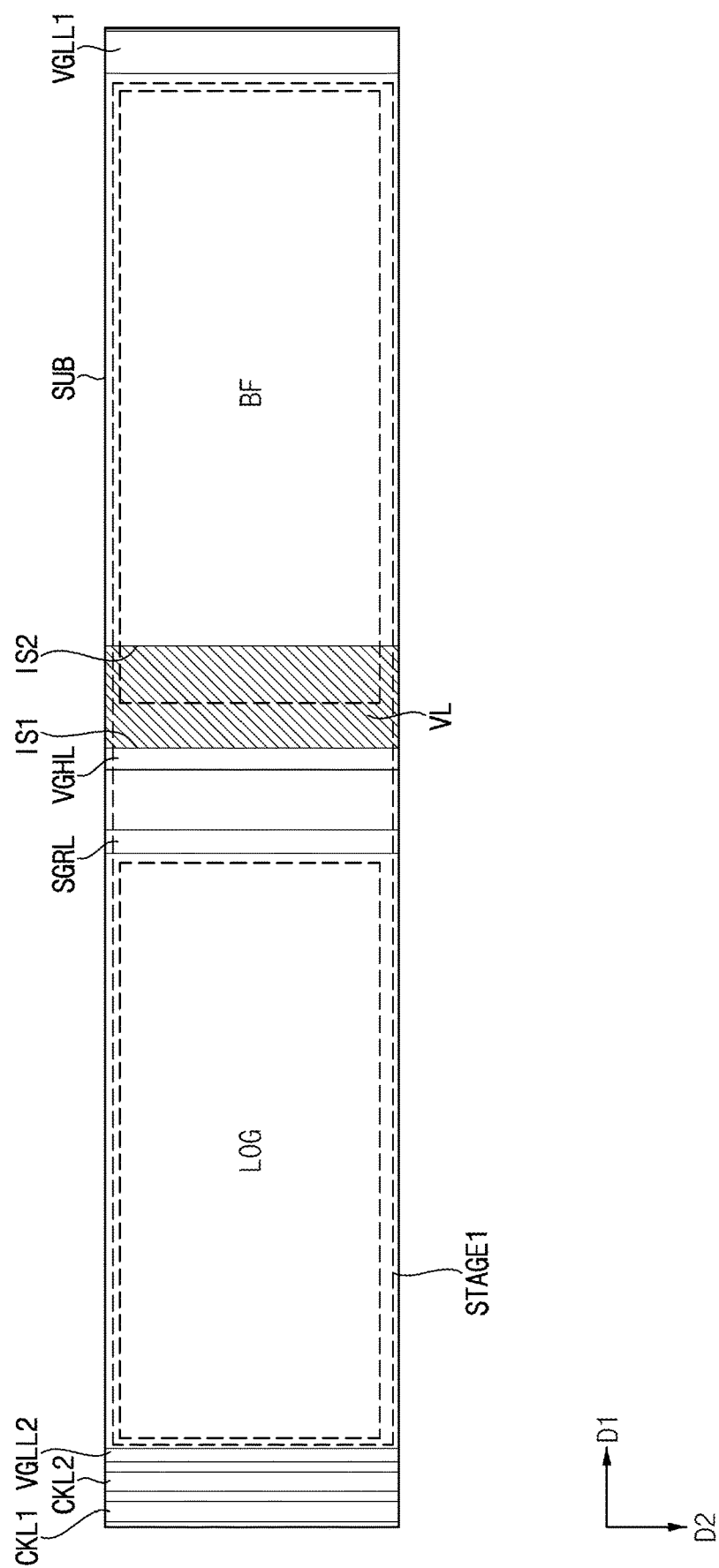
Figure 20:
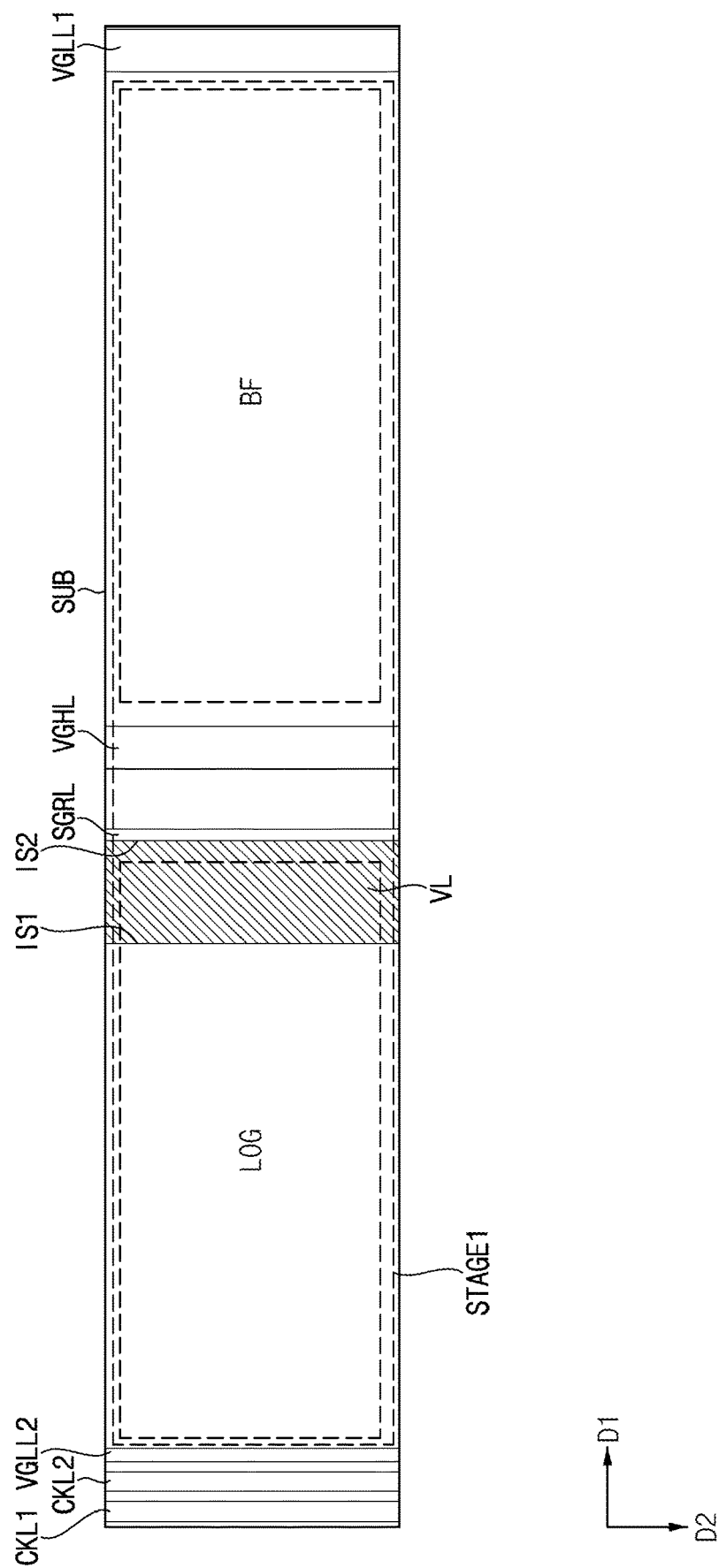
Figure 21:
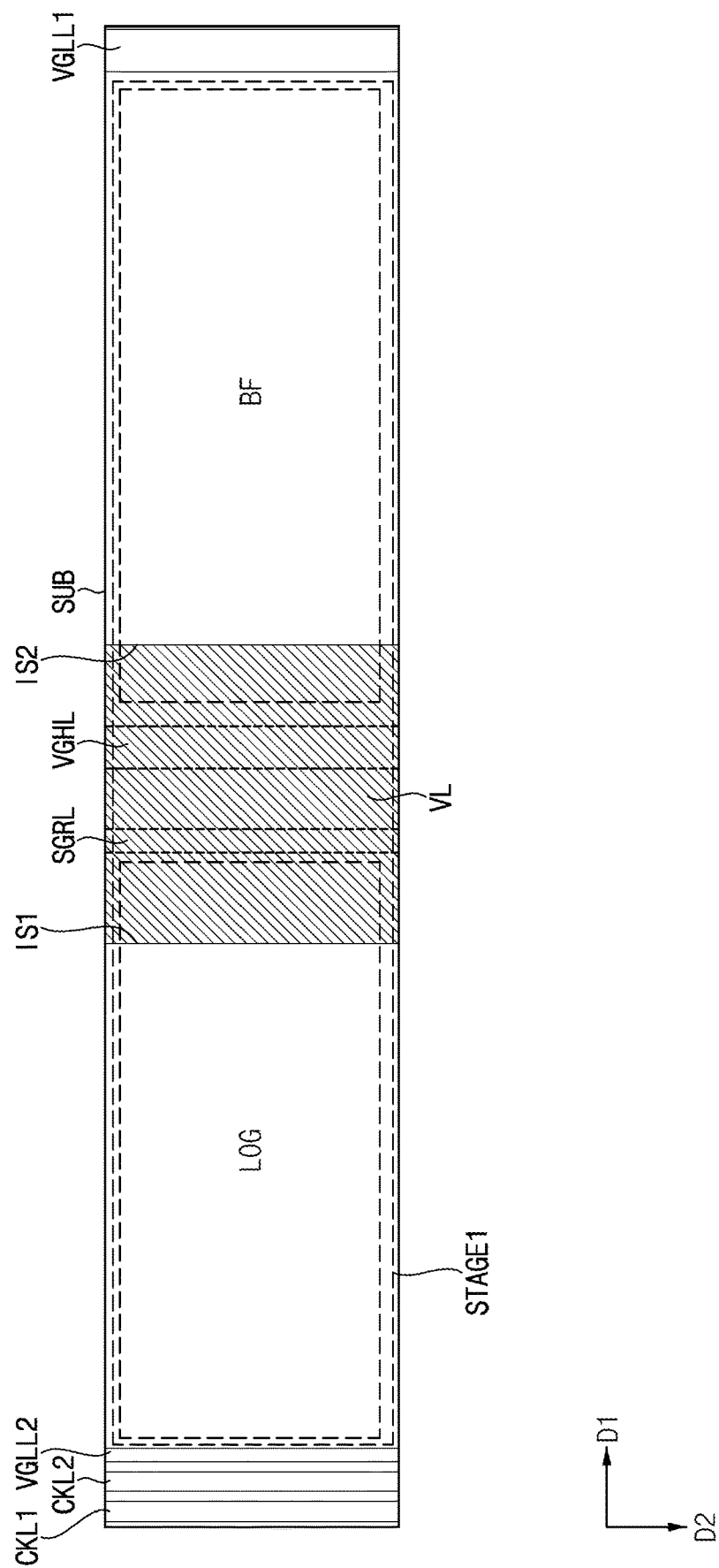

In an embodiment, as shown in FIG. 19, in a plan view, one of the first inner surface IS1 and the second inner surface IS2 may overlap the buffer circuit part BF, and the other one may be spaced apart from the buffer circuit part BF. In an embodiment, as shown in FIG. 20, in a plan view, one of the first inner surface IS1 and the second inner surface IS2 may overlap the logic circuit part LOG, and the other one may be spaced apart from the logic circuit part LOG. In an embodiment, as shown in FIG. 21, in a plan view, one of the first inner surface IS1 and the second inner surface IS2 may overlap the buffer circuit part BF, and the other one may overlap the logic circuit part LOG.

Figure 22:
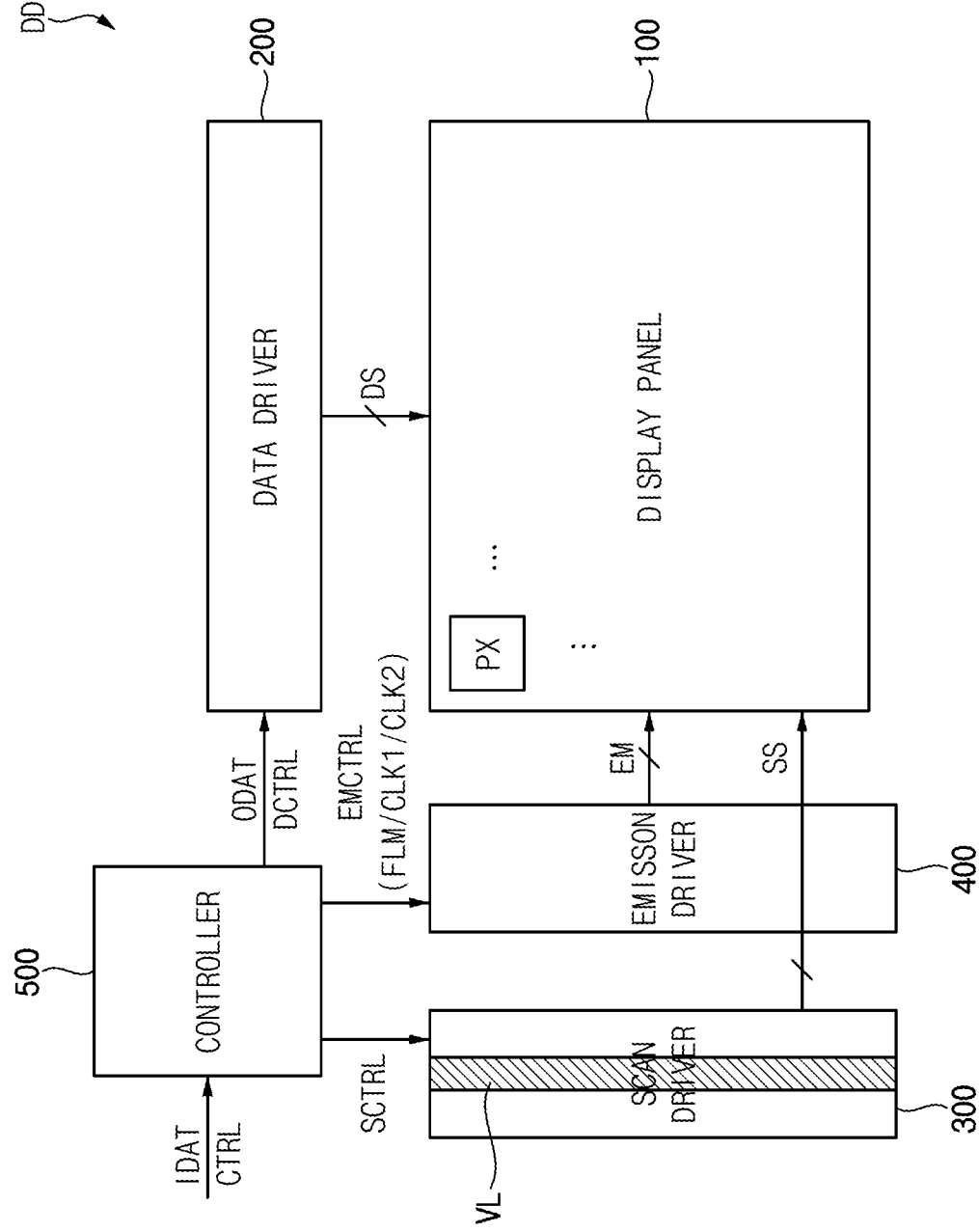
FIGS. 22 and 23 are block diagrams illustrating a display device according to other embodiments.
Figure 23:
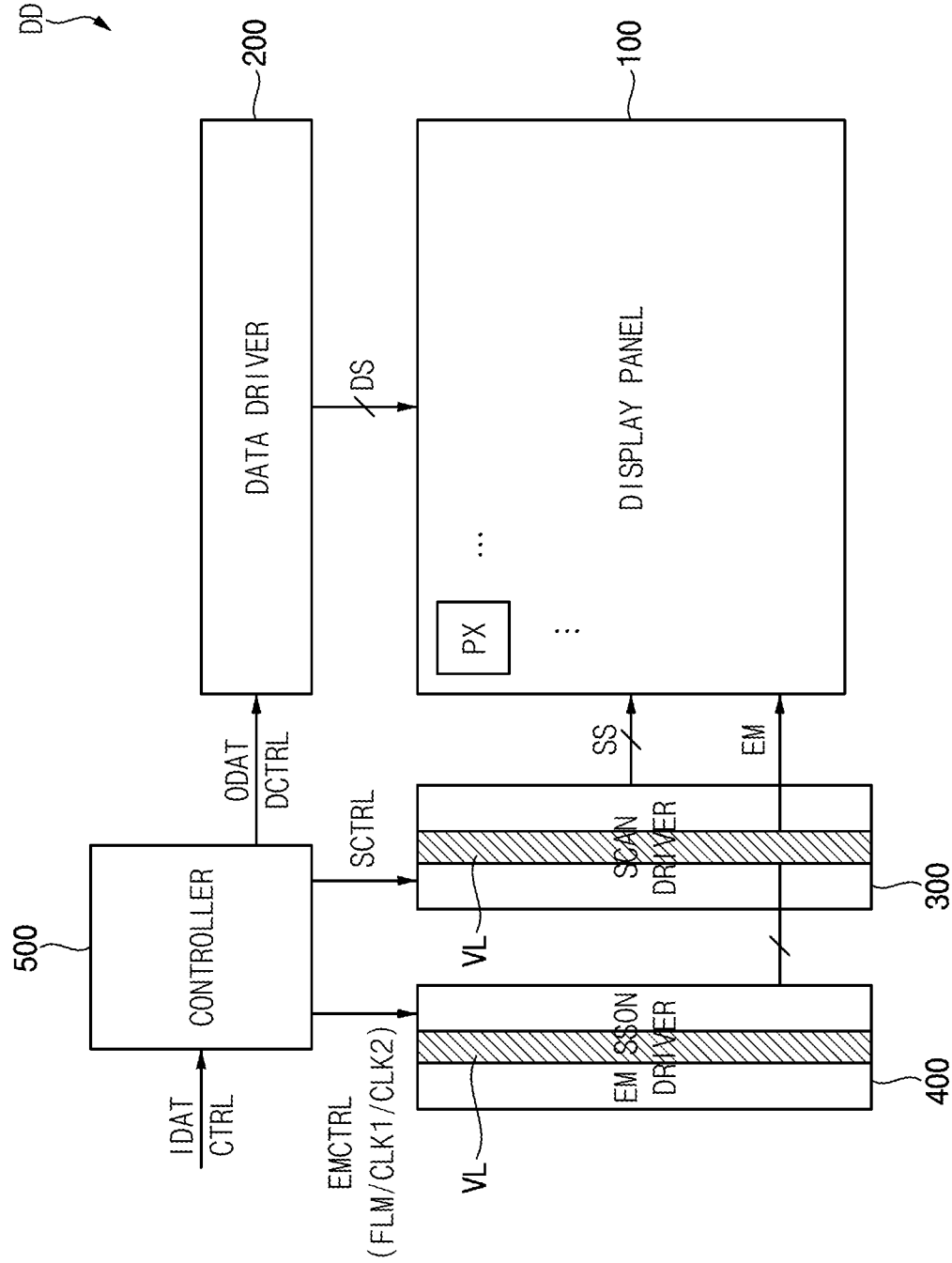

FIGS. 22 and 23 are block diagrams illustrating a display device according to other embodiments. For example, each of FIGS. 22 and 23 may correspond to a block diagram of FIG. 2.

Referring to FIG. 22, in an embodiment, the valley part VL may pass through the scan driver 300. The valley part VL may be disposed inside the scan driver 300. For example, when the scan driver 300 is disposed closer to the periphery of the display device DD than the emission driver 400, the valley part VL may pass through the scan driver 300.

The scan driver 300 may include stages, and transistors included in each of the stages may be NMOS transistors or oxide transistors.

Referring to FIG. 23, in an embodiment, the valley part VL may be two or more. For example, one of the valley parts VL may pass through the emission driver 400 and the other one may pass through the scan driver 300. One of the valley parts VL may be disposed inside the emission driver 400 and the other one may be disposed inside the scan driver 300.

Each of the scan driver 300 and the emission driver 400 may include stages, and transistors included in each of the stages may be NMOS transistors or oxide transistors.

According to embodiments, the display device DD may include the valley part VL defined along the periphery of the display area DA. The first inner surface IS1 and the second inner surface IS2 of the insulating layer defining the valley part VL may overlap the emission driver 400 and/or the scan driver 300 in a plan view. For example, the valley part VL may pass through the emission driver 400 and/or the scan driver 300. The valley part VL may be disposed inside the emission driver 400 and/or the scan driver 300. Accordingly, even if an area of the emission driver 400 and/or an area of the scan driver 300 are increased (for example, the emission driver 400 and/or the scan driver 300 include only NMOS transistors or oxide transistors), the valley part VL may be formed at a position suitable for preventing permeation of moisture from the outside. Accordingly, moisture or gas introduced from the outside may be blocked by the valley part VL and may not flow into the display area DA. Accordingly, a reliability of the display device may be improved.

The disclosure should not be construed as being limited to the embodiments set forth herein. Rather, these embodiments are provided so that this disclosure will be thorough and complete and will fully convey the disclosure to those skilled in the art.

While the disclosure has been shown and described with reference to embodiments thereof, it will be understood by those of ordinary skill in the art that various changes in form and details may be made therein without departing from the spirit or scope of the disclosure and as defined by the following claims.

What is claimed is:

1. A display device comprising:
a display area and a peripheral area adjacent to the display area;
a pixel disposed in the display area on a substrate;
an insulating layer disposed on the substrate and having a valley part along a periphery of the display area in the peripheral area; and
an emission driver disposed in the peripheral area on the substrate, providing an emission signal to the pixel through an emission line, overlapping both a first inner surface and a second inner surface of the insulating layer of the valley part in a plan view, and including stages, wherein
each of the stages includes a logic circuit part and a buffer circuit part, and
the logic circuit part includes an input block which transmits an input signal to a control node and a control block which controls an inversion control node and applies a first low gate voltage to the inversion control node in response to a voltage of the control node.

2. The display device of claim 1, wherein transistors included in the emission driver are NMOS transistors.

3. The display device of claim 1, wherein transistors included in the emission driver are PMOS transistors.

4. The display device of claim 1, wherein
the buffer circuit part including an emission signal output block which outputs a high gate voltage in response to a voltage of the control node and outputs a second low gate voltage in response to a voltage of the inversion control node.

5. The display device of claim 4, wherein the first inner surface and the second inner surface of the insulating layer are disposed between the logic circuit part and the buffer circuit part in a plan view.

6. The display device of claim 4, wherein the valley part overlaps a transmission line electrically connecting the logic circuit part and the buffer circuit part in a plan view.

7. The display device of claim 4, wherein the first inner surface and the second inner surface of the insulating layer overlap the buffer circuit part in a plan view.

8. The display device of claim 7, wherein
the emission signal output block includes:
a first transistor including a gate electrically connected to the inversion control node, a first terminal electrically connected to an emission signal output node through which the emission signal is output, and a second terminal receiving the second low gate voltage; and
a second transistor including a gate electrically connected to the control node, a first terminal receiving the high gate voltage, and a second terminal electrically connected to the emission signal output node, and
the first inner surface and the second inner surface of the insulating layer are disposed between the first transistor and the second transistor in a plan view.

9. The display device of claim 4, wherein the first inner surface and the second inner surface of the insulating layer overlap the logic circuit part in a plan view.

10. The display device of claim 4, wherein
one of the first inner surface and the second inner surface of the insulating layer overlaps the buffer circuit part in a plan view, and
the other of the first inner surface and the second inner surface of the insulating layer is spaced apart from the buffer circuit part in a plan view.

11. The display device of claim 4, wherein
one of the first inner surface and the second inner surface of the insulating layer overlaps the logic circuit part in a plan view, and
the other of the first inner surface and the second inner surface of the insulating layer is spaced apart from the logic circuit part in a plan view.

12. The display device of claim 4, wherein
one of the first inner surface and the second inner surface of the insulating layer overlaps the buffer circuit part in a plan view, and
the other of the first inner surface and the second inner surface of the insulating layer overlaps the logic circuit part in a plan view.

13. The display device of claim 4, wherein the logic circuit part further includes:
a carry signal output block which outputs the high gate voltage as a carry signal in response to the voltage of the control node, and outputs a second low gate voltage different from the first low gate voltage as the carry signal in response to the voltage of the inversion control node.

14. The display device of claim 4, wherein the logic circuit part further includes a boosting block which boosts the voltage of the control node.

15. The display device of claim 1, wherein
the insulating layer includes a first organic insulating layer covering transistors included in the emission driver and a second organic insulating layer disposed on the first organic insulating layer, and
the valley part includes a first valley portion and a second valley portion.

16. The display device of claim 15, wherein
a width of the first valley portion is less than a width of the second valley portion, and
the first inner surface and the second inner surface of the valley part have a step.

17. The display device of claim 15, wherein
the insulating layer further includes a third organic insulating layer disposed on the second organic insulating layer and having a pixel opening defining the pixel, and
a portion of the third organic insulating layer corresponding to the valley part is removed.

18. The display device of claim 1, wherein
the pixel includes a pixel circuit including at least one transistor and a light emitting device electrically connected to the pixel circuit, and
the light emitting device includes:
an anode electrode disposed on the substrate;
an emission layer disposed on the anode electrode; and
a cathode electrode disposed on the emission layer.

19. The display device of claim 18, further comprising:
a capping layer disposed in the valley part,
wherein the capping layer and the anode electrode include a same material.

20. The display device of claim 18, further comprising:
a capping layer disposed in the valley part,
wherein the capping layer and the cathode electrode include a same material.

21. A display device comprising:
a display area and a peripheral area adjacent to the display area;
a pixel disposed in the display area on a substrate;
an insulating layer disposed on the substrate and having a valley part along a periphery of the display area in the peripheral area; and
a scan driver disposed in the peripheral area on the substrate, providing a scan signal to the pixel through a scan line, overlapping both a first inner surface and a second inner surface of the insulating layer defining the valley part in a plan view, and including stages, wherein
each of the stages includes a logic control part and a buffer circuit part, and
the logic circuit part includes an input block which transmits an input signal to a control node and a control block which controls an inversion control node and applies a first low gate voltage to the inversion control node in response to a voltage of the control node.

22. The display device of claim 21, wherein transistors included in the scan driver are NMOS transistors.

23. The display device of claim 21, wherein transistors included in the scan driver are PMOS transistors.

24. A display device comprising:
a display panel including a pixel;
a data driver providing a data signal to the pixel;
a scan driver providing a scan signal to the pixel;
an emission driver providing an emission signal to the pixel; and
a controller controlling the data driver, the scan driver, and the emission driver, and wherein a valley part disposed in a periphery of the display panel passes through at least one of the scan driver and the emission driver.

* * * * *